US008723893B2

(12) United States Patent
Ohnishi

(10) Patent No.: US 8,723,893 B2
(45) Date of Patent: May 13, 2014

(54) COLOR CONVERSION APPARATUS, IMAGING APPARATUS, STORAGE MEDIUM STORING COLOR CONVERSION PROGRAM AND STORAGE MEDIUM STORING IMAGING PROGRAM

(75) Inventor: Naonori Ohnishi, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 825 days.

(21) Appl. No.: 12/216,170

(22) Filed: Jun. 30, 2008

(65) Prior Publication Data

US 2009/0273615 A1 Nov. 5, 2009

Related U.S. Application Data

(63) Continuation-in-part of application No. 12/153,365, filed on May 16, 2008.

(30) Foreign Application Priority Data

May 2, 2008 (JP) ................................ 2008-120380
Jun. 20, 2008 (JP) ................................ 2008-161222

(51) Int. Cl.
*G09G 5/10* (2006.01)
*G03F 3/08* (2006.01)
*H04N 1/46* (2006.01)
*H04N 9/64* (2006.01)
*H04N 5/222* (2006.01)

(52) U.S. Cl.
USPC ........... 345/690; 358/518; 358/537; 348/251; 348/333.02; 348/333.11; 348/650

(58) Field of Classification Search
None
See application file for complete search history.

(56) References Cited

U.S. PATENT DOCUMENTS 6,125,200 A * 9/2000 Warnock ........................ 382/164
6,940,523 B1 * 9/2005 Evoy ............................. 345/604

(Continued)

FOREIGN PATENT DOCUMENTS

JP 8-163541 6/1996
JP 08-293995 11/1996
JP 08293995 A * 11/1996
JP 2006-203595 8/2006

OTHER PUBLICATIONS

European Search Report issued in EP Appl 08 01 1916 on Oct. 17, 2011.

(Continued)

*Primary Examiner* — Alexander S Beck
*Assistant Examiner* — Kirk Hermann
(74) *Attorney, Agent, or Firm* — Nixon & Vanderhye PC

(57) ABSTRACT

A predetermined display image is displayed on a display device, and a hue of the display image corresponding to an input position obtained from a pointing device is obtained. A predetermined range having the obtained hue at a center thereof is set as a conversion target range, and at least one of saturation, brightness, and hue is changed with respect to a pixel of the display image which has a hue within the conversion target range to display a resultant image on the display device.

33 Claims, 11 Drawing Sheets

(56) References Cited

U.S. PATENT DOCUMENTS

| | | | | |
|---|---|---|---|---|
| 2003/0081831 | A1* | 5/2003 | Fukao et al. | 382/167 |
| 2006/0001928 | A1* | 1/2006 | Hayaishi | 358/518 |
| 2006/0017855 | A1* | 1/2006 | Yamada | 348/650 |
| 2006/0028483 | A1 | 2/2006 | Kondo et al. | |
| 2006/0119870 | A1* | 6/2006 | Ho et al. | 358/1.9 |
| 2007/0121118 | A1 | 5/2007 | Gally et al. | |
| 2007/0121180 | A1* | 5/2007 | Ogawa | 358/518 |
| 2007/0153341 | A1* | 7/2007 | Kang | 358/529 |
| 2007/0165946 | A1 | 7/2007 | Hong et al. | |
| 2008/0088826 | A1* | 4/2008 | Ohyama et al. | 356/51 |
| 2009/0010535 | A1* | 1/2009 | Koishi | 382/167 |
| 2009/0273609 | A1 | 11/2009 | Ohnishi | |
| 2009/0273615 | A1 | 11/2009 | Ohnishi | |

OTHER PUBLICATIONS

Office Action issued in U.S. Appl. No. 12/153,365 on Sep. 16, 2011.

Office Action mailed Oct. 3, 2012 from U.S. Appl. No. 12/153,365.

Office Action mailed Jul. 5, 2012 from U.S. Appl. No. 12/553,348.

Office Action mailed Jan. 19, 2012 from U.S. Appl. No. 12/153,365.

Advisory Action mailed May 7, 2012 from U.S. Appl. No. 12/153,365.

Notice of Allowance, mailed Feb. 7, 2013 in U.S. Appl. No. 12/153,365.

Notice of Allowance, mailed Mar. 13, 2013 in U.S. Appl. No. 12/553,348.

Apr. 28, 2011 Office Action from U.S. Appl. No. 12/153,365.

* cited by examiner

COLOR CONVERSION APPARATUS, IMAGING APPARATUS, STORAGE MEDIUM STORING COLOR CONVERSION PROGRAM AND STORAGE MEDIUM STORING IMAGING PROGRAM

CROSS-REFERENCES TO RELATED APPLICATIONS

The disclosure of Japanese Patent Application Nos. 2008-120380, filed on May 2, 2008, and 2008-161222, filed on Jun. 20, 2008, is incorporated herein by reference. This application is a continuation-in-part of application Ser. No. 12/153,365, filed May 16, 2008, now pending, the entire content of which is hereby incorporated by reference in this application.

FIELD

The technology herein relates to a color conversion apparatus, an imaging apparatus, a storage medium storing a color conversion program, and a storage medium storing an imaging program, and more particularly, to a color conversion apparatus, an imaging apparatus, a storage medium storing a color conversion program, and a storage medium storing an imaging program for converting a color of a displayed image.

BACKGROUND AND SUMMARY

Conventionally, for example, as disclosed in Japanese Laid-Open Patent Publication No. 8-293995 (hereinafter, referred to as Patent Document 1), there have been developed various apparatuses for converting a color of a displayed image into a color desired by a user. An image processing apparatus disclosed in the Patent Document 1 extracts hue, saturation, and brightness of a pixel corresponding to a position designated by the user, and determines maximum and minimum values of these components. Then, when the user designates a color which is desired to change to, the image processing apparatus converts colors of pixels in a previously determined range into the designated color.

However, by the user designating a plurality of positions with respect to a scanned still image, the image processing apparatus disclosed in the Patent Document 1 sets a minimum value to a maximum value of each of hue, saturation, and brightness of each of pixels corresponding to the plurality of positions as a range to be color-converted. Thus, the user needs to designate a plurality of positions with respect to an image in performing color conversion, and an operation becomes troublesome. If the user designates only a single position in performing color conversion, a range to be color-converted is a pinpoint, and it is considered that color conversion with respect to an image is hardly performed.

Therefore, an object of certain example embodiments is to provide a color conversion apparatus, an imaging apparatus, a storage medium storing a color conversion program, and a storage medium storing an imaging program which are capable of performing color conversion desired by a user with respect to a displayed image in accordance with a simple operation.

The certain example embodiments have the following features to attain the object mentioned above. It is noted that reference characters, step numbers, and supplementary explanations in parentheses are merely provided to facilitate the understanding of certain example embodiments in relation to the later-described detailed description, rather than limiting the scope in any way.

A first aspect is a color conversion apparatus (1) for performing color conversion of an image displayed on a display device (12) in accordance with an output from a pointing device (13) for outputting an input position (TP). The color conversion apparatus comprises display image display control means (a CPU 31 executing a step S2, and hereinafter, only a step number is described), input position obtaining means (S54), hue obtaining means (S55, S56), conversion target range setting means (S56), and color conversion means (S57). The display image display control means is means for displaying a predetermined display image on the display device. The input position obtaining means is means for obtaining the input position from the pointing device (Da). The hue obtaining means is means for obtaining a hue of the display image corresponding to the input position obtained by the input position obtaining means. The conversion target range setting means is means for setting a predetermined hue range having the hue obtained by the hue obtaining means at a center thereof as a conversion target range (De). The color conversion means is means for changing at least one of saturation, brightness, and hue with respect to a pixel of the display image which has a hue within the conversion target range, and displaying a resultant image on the display device. It is noted that the pointing device is an input device for designating an input position or coordinates on a screen, and realized, for example, by a touch panel, a mouse, a trackpad, a trackball, a pen tablet, a joystick, a system for detecting a screen position at which a housing of a game controller is pointed, and the like. Further, a method for the color conversion means to change at least one of saturation, brightness, and hue may be realized by changing a data table (e.g. a conversion table) in which saturation, brightness, and hue for displaying the display image are defined, data indicative of at least one of saturation, brightness, and hue among image data indicative of the display image may be directly changed, or at least one of saturation, brightness, and hue may be changed by another method.

In a second aspect based on the first aspect, the display image display control means may display on the display device the display image which is converted into an achromatic image by decreasing saturation of all pixels of a chromatic original image. In this case, the color conversion means returns saturation of a pixel of the display image which has a hue within the conversion target range to saturation in the original image, and displays a resultant image on the display device.

In a third aspect based on the second aspect, the color conversion means may change saturation of a pixel having a hue within the conversion target range which is away from a center of the conversion target range while gradually decreasing a rate of returning the saturation of the pixel to saturation in the original image as the hue is away from the center (FIG. 5).

In a fourth aspect based on the third aspect, the color conversion means may change saturation of a pixel having a hue within the conversion target range which is away from the center of the conversion target range while linearly decreasing a rate of returning the saturation of the pixel to saturation in the original image from 100% to 0% as the hue is away from the center (FIG. 5).

In a fifth aspect based on the first aspect, when the input position obtaining means obtains a plurality of input positions at different timings, the hue obtaining means may obtain a hue of the display image corresponding to each of the input positions. In this case, the conversion target range setting means sets predetermined hue ranges having the hues obtained by the hue obtaining means at centers thereof, respectively, as a first conversion target range and a second conversion target range. Then, the color conversion means changes at least one of saturation, brightness, and hue with respect to a pixel of the display image which has a hue within the first conversion target range and a pixel of the display image which has a hue within the second conversion target range, and displays a resultant image on the display device (FIG. 7).

In a sixth aspect based on the fifth aspect, the color conversion means may change at least one of saturation and brightness of a pixel having a hue within the first conversion target range which is away from the center of the first conversion target range while gradually decreasing a rate of changing at least one of the saturation and the brightness of the pixel as the hue is away from the center. The color conversion means may change at least one of saturation and brightness of a pixel having a hue within the second conversion target range which is away from the center of the second conversion target range while gradually decreasing a rate of changing at least one of the saturation and the brightness of the pixel as the hue is away from the center. When the first conversion target range and the second conversion target range partially overlap with each other, the color conversion means selects a higher rate among a rate of changing at least one of saturation and brightness for the first conversion target range and a rate of changing at least one of saturation and brightness for the second conversion target range, and changes at least one of saturation and brightness of a pixel having a hue within an overlapping range (FIG. 7).

In a seventh aspect based on the fifth aspect, the color conversion means may change at least one of saturation and brightness of a pixel having a hue within the first conversion target range which is away from the center of the first conversion target range while gradually decreasing a rate of changing at least one of the saturation and the brightness of the pixel as the hue is away from the center. The color conversion means may change at least one of saturation and brightness of a pixel having a hue within the second conversion target range which is away from the center of the second conversion target range while gradually decreasing a rate of changing at least one of the saturation and the brightness of the pixel as the hue is away from the center. When the first conversion target range and the second conversion target range partially overlap with each other, the color conversion means changes a rate of changing at least one of saturation and brightness of a pixel having a hue within an overlapping range in a curved manner such that a center of the overlapping range becomes minimum.

In an eighth aspect based on the first aspect, the color conversion apparatus may further comprise imaging means (23, 25). The imaging means is means for taking an image of a vicinity of the color conversion apparatus. In this case, the display image display control means may display an image taken by the imaging means as the display image on the display device in real time.

In a ninth aspect based on the first aspect, the display image display control means may display a chromatic image as the display image on the display device. In this case, as a first example, the color conversion means converts the display image into an achromatic image by decreasing saturation of a pixel of the display image which has a hue within the conversion target range, and displays the achromatic image on the display device.

In a tenth aspect based on the first aspect, the display image display control means may display on the display device the display image whose pixels are converted into black pixels by decreasing brightness of all pixels of a chromatic original image. In this case, the color conversion means returns brightness of a pixel of the display image which has a hue within the conversion target range to brightness in the original image, and displays a resultant image on the display device.

In an eleventh aspect based on the first aspect, the display image display control means may display a chromatic image as the display image on the display device. In this case, as a second example, the color conversion means decreases brightness of a pixel of the display image which has a hue within the conversion target range, and displays a resultant image on the display device.

In a twelfth aspect based on the first aspect, the display image display control means may display a chromatic original image as the display image on the display device. In this case, as a third example, the color conversion means changes a hue of a pixel of the display image which has the hue within the conversion target range so as to be close to a conversion target hue, and displays a resultant image on the display device.

In a thirteenth aspect based on the twelfth aspect, the color conversion means changes a hue of a pixel having the hue which is within the conversion target range and away from a center of the conversion target range so as to be close to the conversion target hue as the hue is close to the center (FIG. 11).

In a fourteenth aspect based on the twelfth aspect, when the input position obtaining means obtains a first input position, the hue obtaining means obtains a hue at the first input position in the display image as a first hue. When the hue obtaining means obtains the hue at the first input position as the first hue, the color conversion means changes, among each pixel of the display image, a hue of a pixel having the hue within a first conversion target range having at a center thereof the first hue obtained by the hue obtaining means so as to be close to a first conversion target hue, and displays a resultant image on the display device. When the input position obtaining means obtains a second input position after obtaining the first input position, the hue obtaining means obtains a hue at the second input position in the display image as a second hue. When the hue obtaining means obtains the hue at the second input position as the second hue, the color conversion means changes, among each pixel of the display image, a hue of a pixel having the hue within a second conversion target range having at a center thereof the second hue so as to be close to a second conversion target hue, and displays a resultant image on the display device. It is noted that the first conversion target hue and the second conversion target hue may be the same as each other or may be different from each other.

In a fifteenth aspect based on the fourteenth aspect, when the first conversion target range and the second conversion target range partially or entirely overlap with each other, the color conversion means changes, with respect to a pixel having a hue within the overlapping range, a hue of the pixel which is changed for the first conversion target range so as to be close to the second conversion target hue based on the changed hue.

In a sixteenth aspect based on the twelfth aspect, when the input position obtaining means obtains an input position, the color conversion means sets the conversion target hue based on a hue of a pixel at the input position which is displayed on the display device immediately before the input position is obtained.

In a seventeenth aspect based on the fourteenth aspect, when the input position obtaining means obtains the second input position, the color conversion means sets the second conversion target hue based on a hue of a pixel at the second input position which is displayed on the display device immediately before the second input position is obtained.

In an eighteenth aspect based on the twelfth aspect, the color conversion means sequentially changes the conversion target hue as time passes, and displays a resultant image on the display device (FIG. 10).

In a nineteenth aspect based on the first aspect, the color conversion means further may change a color attribute with respect to a pixel of the display image which has a hue outside the conversion target range in a manner which is different from a manner of changing a color attribute with respect to a pixel having a hue within the conversion target range, and displays a resultant image on the display device.

A twentieth aspect is an imaging apparatus for converting a color of a taken image displayed on a display device in accordance with an output from a pointing device for outputting an input position. The imaging apparatus comprises imaging means, taken image display control means, input position obtaining means, hue obtaining means, conversion target range setting means, and color conversion means. The imaging means is means for taking an image of a vicinity of the imaging apparatus. The taken image display control means is means for displaying a taken image taken by the imaging means on the display device in real time. The input position obtaining means is means for obtaining the input position from the pointing device. The hue obtaining means is means for obtaining a hue of the taken image corresponding to the input position obtained by the input position obtaining means. The conversion target range setting means is means for setting a predetermined hue range having the hue obtained by the hue obtaining means at a center thereof as a conversion target range. The color conversion means is means for changing at least one of saturation, brightness, hue with respect to a pixel of the taken image which has a hue within the conversion target range, and displaying a resultant image on the display device.

A twenty-first aspect is a computer-readable storage medium storing an imaging program executed by a computer (31) for converting a color of a taken image displayed on a display device in accordance with an output from a pointing device for outputting an input position. The imaging program causes the computer to operate as: taken image display control means; input position obtaining means; hue obtaining means; conversion target range setting means; and color conversion means. The taken image display control means is means for displaying a taken image taken by imaging means for taking an image of a vicinity on the display device in real time. The input position obtaining means is means for obtaining the input position from the pointing device. The hue obtaining means is means for obtaining a hue of the taken image corresponding to the input position obtained by the input position obtaining means. The conversion target range setting means is means for setting a predetermined hue range having the hue obtained by the hue obtaining means at a center thereof as a conversion target range. The color conversion means is means for changing at least one of saturation, brightness, and hue with respect to a pixel of the taken image which has a hue within the conversion target range, and displaying a resultant image on the display device.

According to the first aspect, only by the user once performing an operation with respect to the display image displayed on the display device to designate an input position or coordinates using the pointing device, it is possible to perform color conversion of the display image which is desired by the user. Further, when color conversion is performed with a color conversion target limited to only a hue of a pixel overlapping with the input position, it is considered that a significantly limited region (in an extreme case, only a pixel overlapping with the input position) of the display image is color-converted, and color conversion desired by the user cannot be performed. On the other hand, it is rare that the user desires to color-convert only a hue designated by the input position, and generally, the user desires hues adjacent to the hue to some extent to be color conversion targets. According to the first aspect, not only a hue corresponding to the touch position but also hues in a predetermined range having the hue at a center thereof are set to a range of a color conversion target. Thus, by setting the hues in the predetermined range as color conversion targets, hues slightly different from the hue of the pixel overlapping with the touch position can be color conversion targets, thereby enabling color conversion desired by the user to be performed.

According to the second aspect, only by the user once performing an operation with respect to the achromatic image displayed on the display device to designate a position at which a color desired by the user is originally expressed, it is possible to perform color conversion such that the color is restored in the achromatic image.

According to the third and fourth aspects, by setting the saturation so as to be gradually decreased with the hue which is set corresponding to the input position as a center, noise can be reduced in performing color conversion, and it is possible to convert into an image such that color which is originally expressed at the input position is naturally added.

According to the fifth aspect, when the user designates a plurality of input positions, it is possible to perform color conversion with respect to a hue corresponding to each of the input positions.

According to the sixth and seventh aspects, when color conversion with respect to a hue corresponding to each of the input positions is performed by the user designating a plurality of input positions, rates of changing attribute parameters with respect to hues within a range where the color conversions overlap with each other are smoothly connected, and it is possible to convert into an image such that a plurality of color conversion are naturally performed.

According to the eighth aspect, it is possible to perform color conversion processing with respect to the taken real-time image.

According to the ninth aspect, only by the user once performing an operation with respect to the chromatic image displayed on the display device to designate a position at which a color desired by the user is displayed, it is possible to perform color conversion such that the color designated in the chromatic image becomes an achromatic color.

According to the tenth aspect, only by the user once performing an operation with respect to the image which is filled with black and displayed on the display device to designate a position desired by the user, it is possible to perform color conversion such that only a color at the position designated by the user appears on the black image.

According to the eleventh aspect, only by the user once performing an operation with respect to the chromatic image displayed on the display device to designate a position at which a color desired by the user is displayed, it is possible to perform color conversion such that the color designated in the chromatic image is converted into a dark color.

According to the twelfth aspect, only by the user once performing an operation with respect to the chromatic image displayed on the display device to designate a position at which a color desired by the user is displayed, it is possible to perform color conversion such that the color designated in the chromatic image is converted so as to be close to a different color (a conversion target hue).

According to the thirteenth aspect, by making setting such that, with a hue set in accordance with an input position as a center, an original hue is changed so as to be gradually close to the conversion target hue as being close to the center, noise can be reduced in performing color conversion, and it is possible to convert into an image such that color is naturally changed.

According to the fourteenth aspect, when the user performs an operation of designating a different hue with respect to the display image, it is possible to perform color conversion such that a pixel having each hue is converted so as to be close to the first conversion target hue or the second conversion target hue.

According to the fifteenth aspect, when color conversion is performed with respect to a hue corresponding to each input position by the user designating a plurality of input positions, hue conversion performed with respect to hues within a range where the color conversions overlap with each other can be smoothly connected, and it is possible to convert into an image such that a plurality of color conversion are naturally performed.

According to the sixteenth aspect, when the user performs an operation of designating a different hue with respect to the display image, it is possible to perform color conversion such that a pixel having each hue is converted so as to be close to a different hue.

According to the seventeenth aspect, by the user repeating an operation of designating a position, it is possible to perform color conversion such that the designated color is sequentially changed to a different color.

According to the eighteenth aspect, it is possible to convert into an image such that a hue set in accordance with an input position is sequentially changed as time passes.

According to the nineteenth aspect, only by performing different color conversion (e.g. color conversion in which a color attribute to be changed is different, or color conversion in which a color attribute to be changed is the same but a direction of change is different) with respect to a pixel having a hue outside the conversion target range, it is possible to perform various color conversion with respect to the display image.

Further, according to the imaging apparatus and the storage medium storing the imaging program according certain example embodiments, the same advantageous effects as those of the above color conversion apparatus can be obtained.

These and other objects, features, aspects and advantages of certain example embodiments will become more apparent from the following detailed description when taken in conjunction with the accompanying drawings.

DETAILED DESCRIPTION

Figure 1:
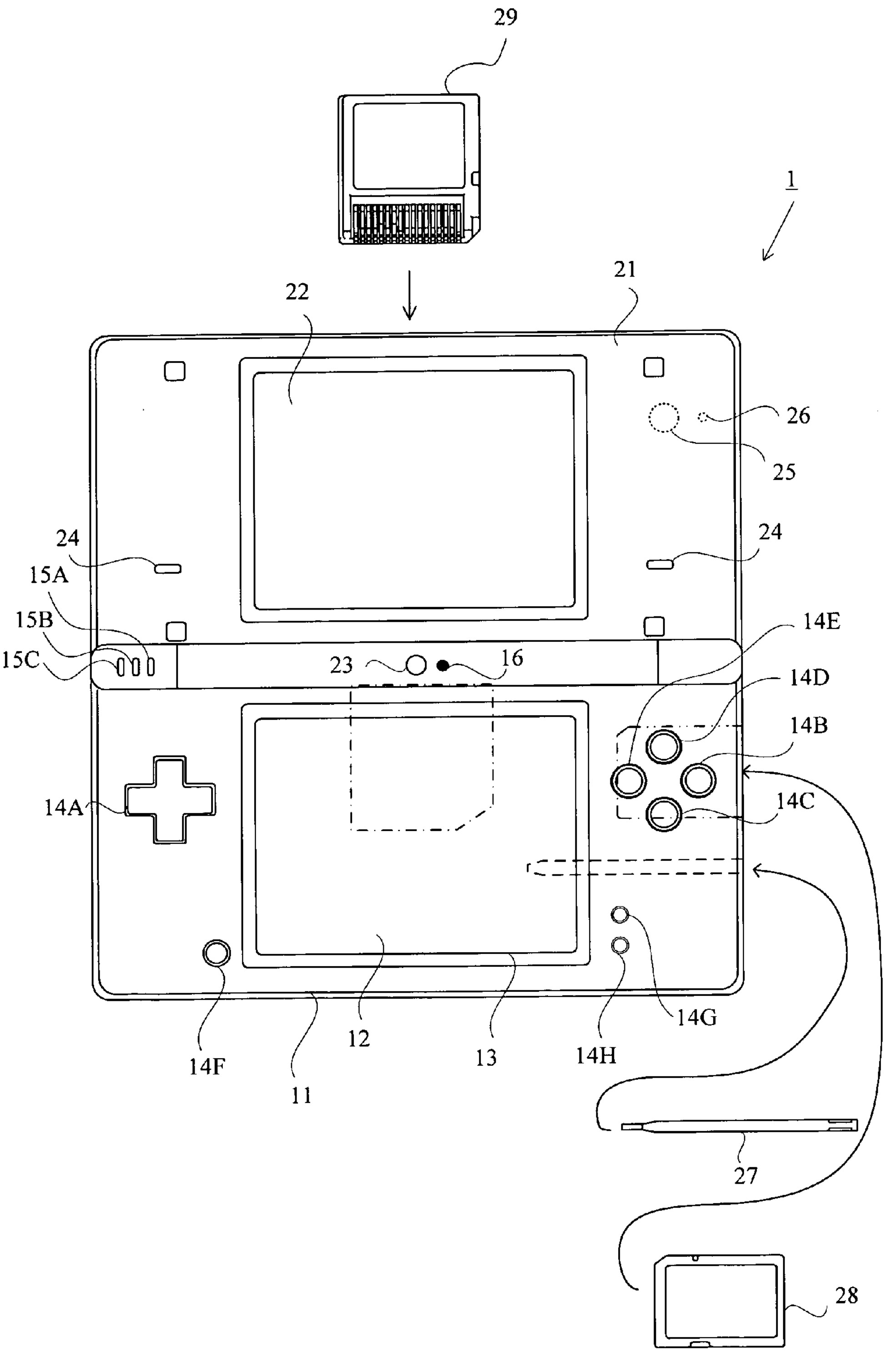
FIG. 1 is an external view of a game apparatus 1 executing a color conversion program according to an embodiment.

With reference to the drawings, a color conversion apparatus executing a color conversion program according to an embodiment will be described. Although the color conversion program is usable by executing it by any computer system capable of performing a display on a display device, a game apparatus 1 is used as an example of the color conversion apparatus, and the color conversion program is described using a color conversion program executed by the game apparatus 1. FIG. 1 is an external view of the game apparatus 1 executing the color conversion program. Here, a hand-held game apparatus is shown as an example of the game apparatus 1. The game apparatus 1 includes a camera, and functions as an imaging apparatus to take an image with the camera, to display the taken image on a screen, and to store data of the taken image.

As shown in FIG. 1, the game apparatus 1 is a foldable hand-held game apparatus in an opened state. The game apparatus 1 is configured to have such a size as to be held by a user with both hands or one hand.

The game apparatus 1 includes a lower housing 11 and an upper housing 21. The lower housing 11 and the upper housing 21 are connected to each other so as to be capable of being opened or closed (foldable). In an example of FIG. 1, the lower housing 11 and the upper housing 21 are each formed in a plate-like shape of a horizontally long rectangle, and foldably connected to each other at long side portions thereof. Usually, the user uses the game apparatus 1 in the opened state. When not using the game apparatus 1, the user keeps the game apparatus 1 in a closed state. In the example shown in FIG. 1, in addition to the closed state and the opened state, the game apparatus 1 is capable of maintaining an angle between the lower housing 11 and the upper housing 21 at any angle ranging between the closed state and the opened state by frictional force generated at a connection portion, and the like. In other words, the upper housing 21 can be stationary at any angle with respect to the lower housing 11.

In the lower housing 11, a lower LCD (Liquid Crystal Display) 12 is provided. The lower LCD 12 has a horizontally long shape, and is located such that a long side direction thereof corresponds to a long side direction of the lower housing 11. It is noted that although an LCD is used as a display device provided in the game apparatus 1 in the present embodiment, any other display devices such as a display device using an EL (Electro Luminescence), and the like may be used. In addition, the game apparatus 1 can use a display device of any resolution. Although details will be described later, the lower LCD 12 is used mainly for displaying an image taken by a camera 23 or 25 in real time.

In the lower housing 11, operation buttons 14A to 14K and a touch panel 13 are provided as input devices. As shown in FIG. 1, among the operation buttons 14A to 14K, the direction input button 14A, the operation button 14B, the operation button 14C, the operation button 14D, the operation button 14E, the power button 14F, the start button 14G, and the select button 14H are provided on an inner main surface of the lower housing 11 which is located inside when the upper housing 21 and the lower housing 11 are folded. The direction input button 14A is used, for example, for a selection operation, and the like. The operation buttons 14B to 14E are used, for example, for a determination operation, a cancellation operation, and the like. The power button 14F is used for turning on or off the power of the game apparatus 1. In the example shown in FIG. 1, the direction input button 14A and the power button 14F are provided on the inner main surface of the lower housing 11 and on one of a left side and a right side (on the left side in FIG. 1) of the lower LCD 12 provided in the vicinity of a center of the inner main surface of the lower housing 11. Further, the operation buttons 14B to 14E, the start button 14G, and the select button 14H are provided on the inner main surface of the lower housing 11 and on the other of the left side and the right side (on the right side in FIG. 1) of the lower LCD 12. The direction input button 14A, the operation buttons 14B to 14E, the start button 14G, and the select button 14H are used for performing various operations with respect to the game apparatus 1.

It is noted that the operation buttons 14F to 14K are omitted in FIG. 1. For example, the L button 14I is provided at a left end of an upper surface of the lower housing 11, and the R button 14J is provided at a right end of the upper surface of the lower housing 11. The L button 14I and the R button 14J are used, for example, for performing a photographing instruction operation (a shutter operation) with respect to the game apparatus 1. In addition, the volume button 14K is provided on a left side surface of the lower housing 11. The volume button 14K is used for adjusting volume of speakers of the game apparatus 1.

The game apparatus 1 further includes the touch panel 13 as another input device in addition to the operation buttons 14A to 14K. The touch panel 13 is mounted so as to cover a screen of the lower LCD 12. In the present embodiment, the touch panel 13 is, for example, a resistive film type touch panel. However, the touch panel 13 is not limited to the resistive film type, but any press-type touch panel may be used. The touch panel 13 used in the present embodiment has the same resolution (detection accuracy) as that of the lower LCD 12. However, the resolution of the touch panel 13 and the lower LCD 12 may not necessarily be the same as each other. In the right side surface of the lower housing 11, an insertion opening (a dotted line shown in FIG. 1) is provided. The insertion opening is capable of accommodating a touch pen 27 which is used for performing an operation with respect to the touch panel 13. Although an input with respect to the touch panel 13 is usually performed using the touch pen 27, in addition to the touch pen 27, a finger of the user can be used for operating the touch panel 13.

In the right side surface of the lower housing 11, an insertion opening (indicated by a two-dot chain line in FIG. 1) is provided for accommodating a memory card 28. Inside the insertion opening, a connector (not shown) is provided for electrically connecting the game apparatus 1 to the memory card 28. The memory card 28 is, for example, an SD (Secure Digital) memory card, and detachably mounted to the connector. The memory card 28 is used, for example, for storing an image taken by the game apparatus 1, and loading an image generated by another apparatus into the game apparatus 1.

Further, in the upper surface of the lower housing 11, an insertion opening (indicated by a chain line in FIG. 1) is provided for accommodating a memory card 29. Inside the insertion opening, a connector (not shown) is provided for electrically connecting the game apparatus 1 to the memory card 29. The memory card 29 is a storage medium storing a color conversion program, a game program, and the like, and detachably mounted in the insertion opening provided in the lower housing 11.

Three LEDs 15A to 15C are mounted to a left side part of the connection portion where the lower housing 11 and the upper housing 21 are connected to each other. The game apparatus 1 is capable of performing wireless communication with another apparatus, and the first LED 15A is lit up while wireless communication is established. The second LED 15B is lit up while the game apparatus 1 is charged. The third LED 15C is lit up while the power of the game apparatus 1 is ON. Thus, by the three LEDs 15A to 15C, a state of communication establishment of the game apparatus 1, a state of charge of the game apparatus 1, and a state of ON/OFF of the power of the game apparatus 1 can be notified to the user.

Meanwhile, in the upper housing 21, an upper LCD 22 is provided. The upper LCD 22 has a horizontally long shape, and is located such that a long side direction thereof corresponds to a long side direction of the upper housing 21. Similarly as the lower LCD 12, a display device of another type having any resolution may be used instead of the upper LCD 22. A touch panel may be provided so as to cover the upper LCD 22. For example, the upper LCD 22 displays thereon an operation explanation screen for informing the user of roles of the operation buttons 14A to 14K and the touch panel 13.

In the upper housing 21, two cameras (the inner camera 23 and the outer camera 25) are provided. As shown in FIG. 1, the inner camera 23 is mounted in an inner main surface of the upper housing 21 and adjacent to the connection portion. On the other hand, the outer camera 25 is mounted in a surface opposite to the surface in which the inner camera 23 is mounted, namely, in an outer main surface of the upper housing 21 (which is a surface located on the outside of the game apparatus 1 in the closed state, and a back surface of the upper housing 21 shown in FIG. 1). In FIG. 1, the outer camera 25 is indicated by a dashed line. Thus, the inner camera 23 is capable of taking an image in a direction in which the inner main surface of the upper housing 21 faces, and the outer camera 25 is capable of taking an image in a direction opposite to an imaging direction of the inner camera 23, namely, in a direction in which the outer main surface of the upper housing 21 faces. In other words, in the present embodiment, the two cameras 23 and 25 are provided such that the imaging directions thereof are opposite to each other. For example, the user can take an image of a view seen from the game apparatus 1 toward the user with the inner camera 23 as well as an image of a view seen from the game apparatus 1 in a direction opposite to the user with the outer camera 25.

In the inner main surface and adjacent to the connection portion, a microphone (a microphone 42 shown in FIG. 10) as a voice input device is accommodated. In the inner main surface and adjacent to the connection portion, a microphone hole 16 is formed to allow the microphone 42 to detect sound outside the game apparatus 1. The accommodating position of the microphone 42 and the position of the microphone hole 16 are not necessarily in the connection portion. For example, the microphone 42 may be accommodated in the lower housing 11, and the microphone hole 16 may be provided in the lower housing 11 so as to correspond to the accommodating position of the microphone 42.

In the outer main surface of the upper housing 21, a fourth LED 26 (indicated by a dashed line in FIG. 1) is mounted. The fourth LED 26 is lit up at a time when photographing is performed with the inner camera 23 or the outer camera 25 (a shutter button is pressed). Further, the fourth LED 26 is lit up while a moving picture is taken by the inner camera 23 or the outer camera 25. By the fourth LED 26, it is notified to an object person whose image is taken and people around the object person that photographing is performed (being performed) by the game apparatus 1.

Sound holes 24 are formed in the inner main surface of the upper housing 21 and on each of left and right sides of the upper LCD 22 provided in the vicinity of a center of the inner main surface of the upper housing 21. The speakers are accommodated in the upper housing 21 and at the back of the sound holes 24. The sound holes 24 are holes for releasing sound from the speakers therethrough.

As described above, the inner camera 23 and the outer camera 25 which are configurations for taking an image, and the upper LCD 22 which is display means for displaying mainly the operation explanation screen are provided in the upper housing 21. On the other hand, the input devices for performing an operation input with respect to the game apparatus 1 (the touch panel 13 and the buttons 14A to 14I), and the lower LCD 12 which is display means for displaying a taken image are provided in the lower housing 11. Thus, when using the game apparatus 1, the user can hold the lower housing 11 and perform an input with respect to the input device while looking at a taken image (an image taken by the camera) displayed on the lower LCD 12.

Figure 2:
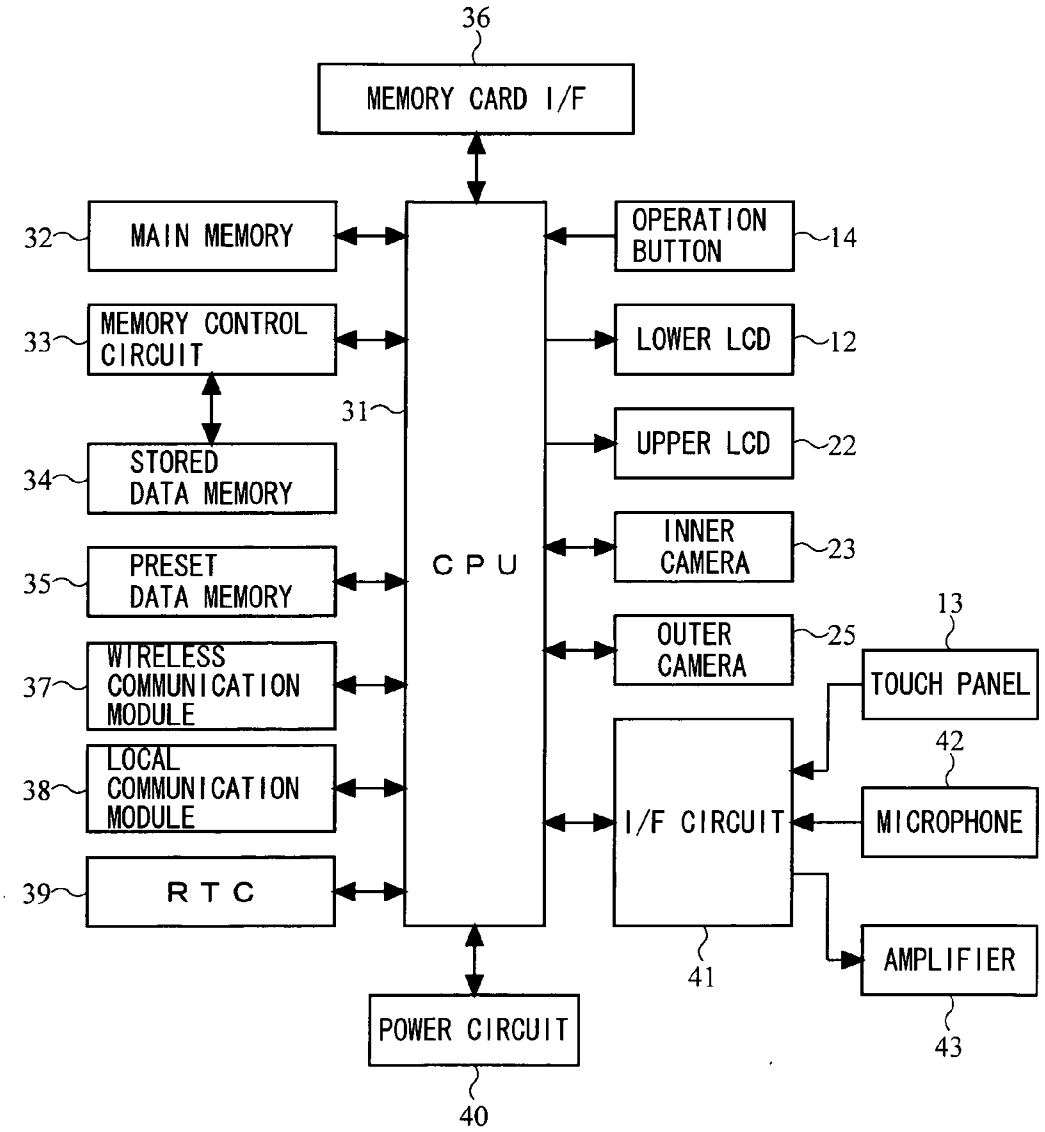
FIG. 2 is a block diagram showing an example of an internal configuration of the game apparatus 1 of FIG. 1.

The following will describe an internal configuration of the game apparatus 1 with reference to FIG. 2. FIG. 2 is a block diagram showing an example of the internal configuration of the game apparatus 1.

As shown in FIG. 2, the game apparatus 1 includes electronic components including a CPU 31, a main memory 32, a memory control circuit 33, a stored data memory 34, a preset data memory 35, a memory card interface (memory card I/F) 36, a wireless communication module 37, a local communication module 38, a real time clock (RTC) 39, a power circuit 40, an interface circuit (I/F circuit) 41, and the like. These electronic components are mounted on an electronic circuit substrate and accommodated in the lower housing 11 (or may be accommodated in the upper housing 21).

The CPU 31 is information processing means for executing a predetermined program. In the present embodiment, the predetermined program is stored in a memory (e.g. the stored data memory 34) within the game apparatus 1 or in the memory cards 28 and/or 29, and the CPU 31 executes later-described color conversion processing by executing the predetermined program. It is noted that the program executed by the CPU 31 may be stored in advance in a memory within the game apparatus 1, may be obtained from the memory cards 28 and/or 29, or may be obtained from another apparatus by means of communication with the other apparatus.

The main memory 32, the memory control circuit 33, and the preset data memory 35 are connected to the CPU 31. The stored data memory 34 is connected to the memory control circuit 33. The main memory 32 is storage means used as a work area and a buffer area of the CPU 31. In other words, the main memory 32 stores various data used in the color conversion processing, and also stores a program obtained from the outside (the memory cards 28 and 29, another apparatus, and the like). In the present embodiment, for example, a PSRAM (Pseudo-SRAM) is used as the main memory 32. The stored data memory 34 is storage means for storing the program executed by the CPU 31, data of images taken by the cameras 23 and 25, and the like. The stored data memory 34 is constructed of a nonvolatile storage means, for example, a NAND flash memory. The memory control circuit 33 is a circuit for controlling reading of data from the stored data memory 34 or writing of data to the stored data memory 34 in accordance with an instruction from the CPU 31. The preset data memory 35 is storage means for storing data (preset data) of various parameters which are set in advance in the game apparatus 1, and the like. A flash memory connected to the CPU 31 via an SPI (Serial Peripheral Interface) bus can be used as the preset data memory 35.

The memory card I/F 36 is connected to the CPU 31. The memory card I/F 36 reads data from the memory card 28 and the memory card 29 which are mounted to the connectors or writes data to the memory card 28 and the memory card 29 in accordance with an instruction from the CPU 31. In the present embodiment, data of images taken by the cameras 23 and 25 are written to the memory card 28, and image data stored in the memory card 28 are read from the memory card 28 to be stored in the stored data memory 34. Various programs stored in the memory card 29 are read by the CPU 31 to be executed.

The color conversion program may be supplied to a computer system via a wired or wireless communication line, in addition to from an external storage medium such as the memory card 29, and the like. The color conversion program may be stored in advance in a nonvolatile storage unit within the computer system. An information storage medium for storing the color conversion program is not limited to the above nonvolatile storage unit, but may be a CD-ROM, a DVD, or an optical disc-shaped storage medium similar to them.

The wireless communication module 37 functions to connect to a wireless LAN device, for example, by a method conformed to the standard of IEEE 802.11.b/g. The local communication module 38 functions to wirelessly communicate with a game apparatus of the same type by a predetermined communication method. The wireless communication module 37 and the local communication module 38 are connected to the CPU 31. The CPU 31 is capable of receiving data from and sending data to another apparatus via the Internet using the wireless communication module 37, and capable of receiving data from and sending data from another game apparatus of the same type using the local communication module 38.

The RTC 39 and the power circuit 40 are connected to the CPU 31. The RTC 39 counts a time, and outputs the time to the CPU 31. For example, the CPU 31 is capable of calculating a current time (date), and the like based on the time counted by the RTC 39. The power circuit 40 controls electric power from a power supply (typically, a battery accommodated in the lower housing 11) of the game apparatus 1 to supply the electric power to each electronic component of the game apparatus 1.

The game apparatus 1 includes the microphone 42 and an amplifier 43. The microphone 42 and the amplifier 43 are connected to the I/F circuit 41. The microphone 42 detects voice produced by the user toward the game apparatus 1, and outputs a voice signal indicative of the voice to the I/F circuit 41. The amplifier 43 amplifies the voice signal from the I/F circuit 41, and causes the speakers (not shown) to output the voice signal. The I/F circuit 41 is connected to the CPU 31.

The touch panel 13 is connected to the I/F circuit 41. The I/F circuit 41 includes a voice control circuit for controlling the microphone 42 and the amplifier 43 (the speakers), and a touch panel control circuit for controlling the touch panel 13. The voice control circuit performs A/D conversion or D/A conversion with respect to the voice signal, and converts the voice signal into voice data in a predetermined format. The touch panel control circuit generates touch position data in a predetermined format based on a signal from the touch panel 13, and outputs the touch position data to the CPU 31. For example, the touch position data is data indicative of coordinates of a position at which an input is performed with respect to an input surface of the touch panel 13. The touch panel control circuit reads a signal from the touch panel 13 and generates touch position data every a predetermined time period. The CPU 31 is capable of recognizing a position at which an input is performed with respect to the touch panel 13 by obtaining the touch position data.

An operation section 14 includes the above operation buttons 14A to 14K, and is connected to the CPU 31. The operation section 14 outputs operation data indicative of an input state with respect to each of the buttons 14A to 14I (whether or not each button is pressed) to the CPU 31. The CPU 31 obtains the operation data from the operation section 14, and executes processing in accordance with an input with respect to the operation section 14.

The cameras 23 and 25 are connected to the CPU 31. Each of the inner camera 23 and the outer camera 25 takes an image in accordance with an instruction from the CPU 31, and outputs data of the taken image to the CPU 31. In the present embodiment, the CPU 31 gives an imaging instruction to the camera 23 or 25, and the camera which has received the imaging instruction takes an image and sends image data to the CPU 31.

The LCDs 12 and 22 are connected to the CPU 31. Each of the LCDs 12 and 22 displays an image thereon in accordance with an instruction from the CPU 31. In the present embodiment, the CPU 31 causes a taken image obtained from the inner camera 23 or the inner camera 25 to be displayed on the lower LCD 12, and an operation explanation screen generated by predetermined processing to be displayed on the upper LCD 12.

For example, on the upper LCD 22, a photographing instruction button explanation image, a camera change button explanation image, a zoom instruction button explanation image, a display image selection button explanation image, and the like are displayed as the above operation explanation image. The photographing instruction button explanation image is an image indicating a position of the operation button 14 for performing a photographing instruction. The camera change button explanation image is an image indicating a position of the operation button 14 for performing a camera change instruction. The camera change instruction is an instruction to change a camera for taking an image between the inner camera 23 and the outer camera 25. The zoom instruction button explanation image is an image indicating a position of the operation button 14 for performing a zoom change instruction. The zoom change instruction is an instruction to zoom in/out a taken image displayed on the lower LCD 12. The display image selection button explanation image is an image indicating a position of the operation button 14 for performing a display change instruction. The display change instruction is an instruction to select a stored image to be displayed on the lower LCD 12 in the case of displaying a stored image stored in the game apparatus 1 on the lower LCD 12.

Figure 3:
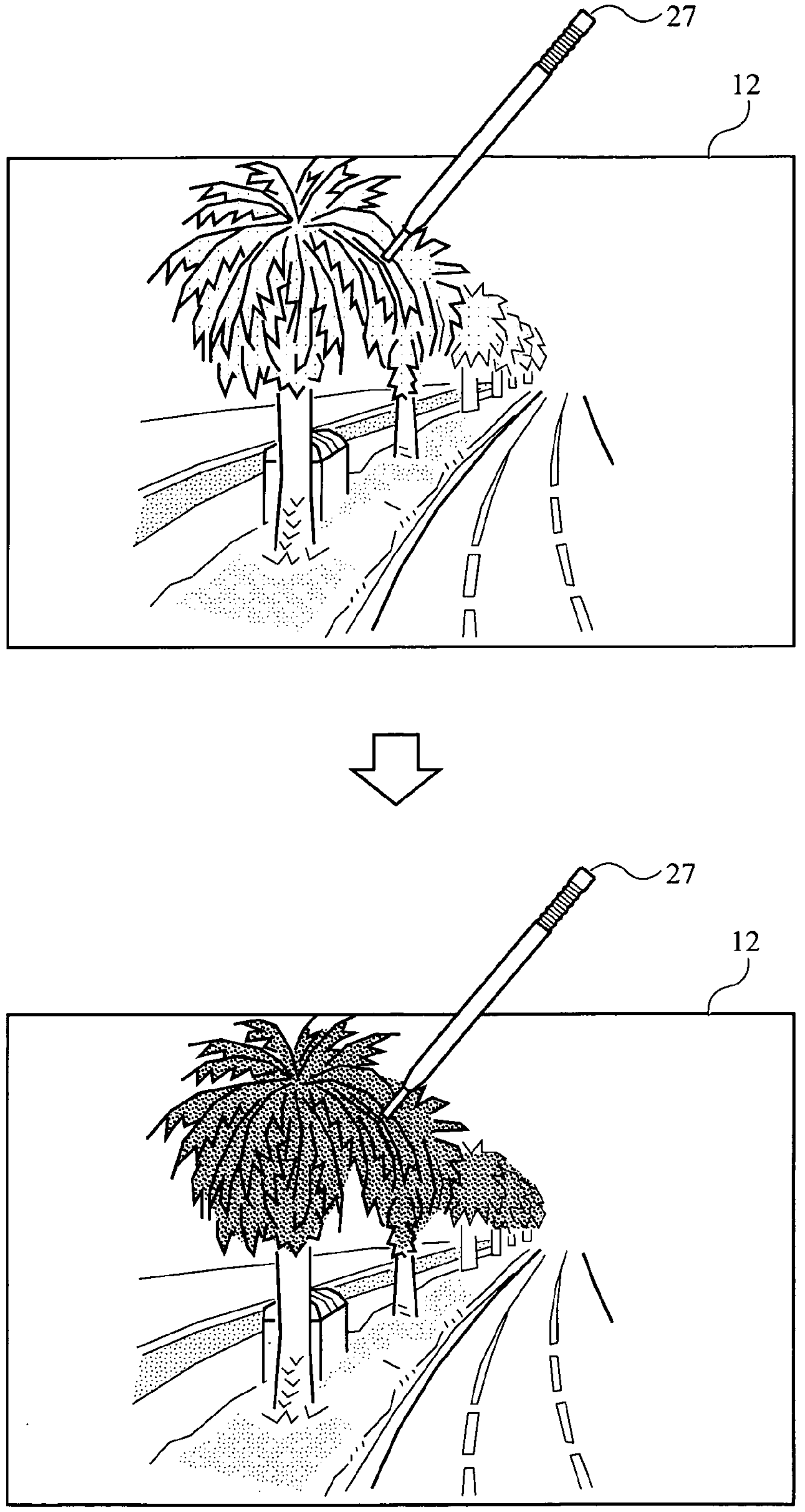
FIG. 3 is a view showing an example of a screen display which is displayed on a lower LCD 12 of FIG. 1 and color-converted.
Figure 4:
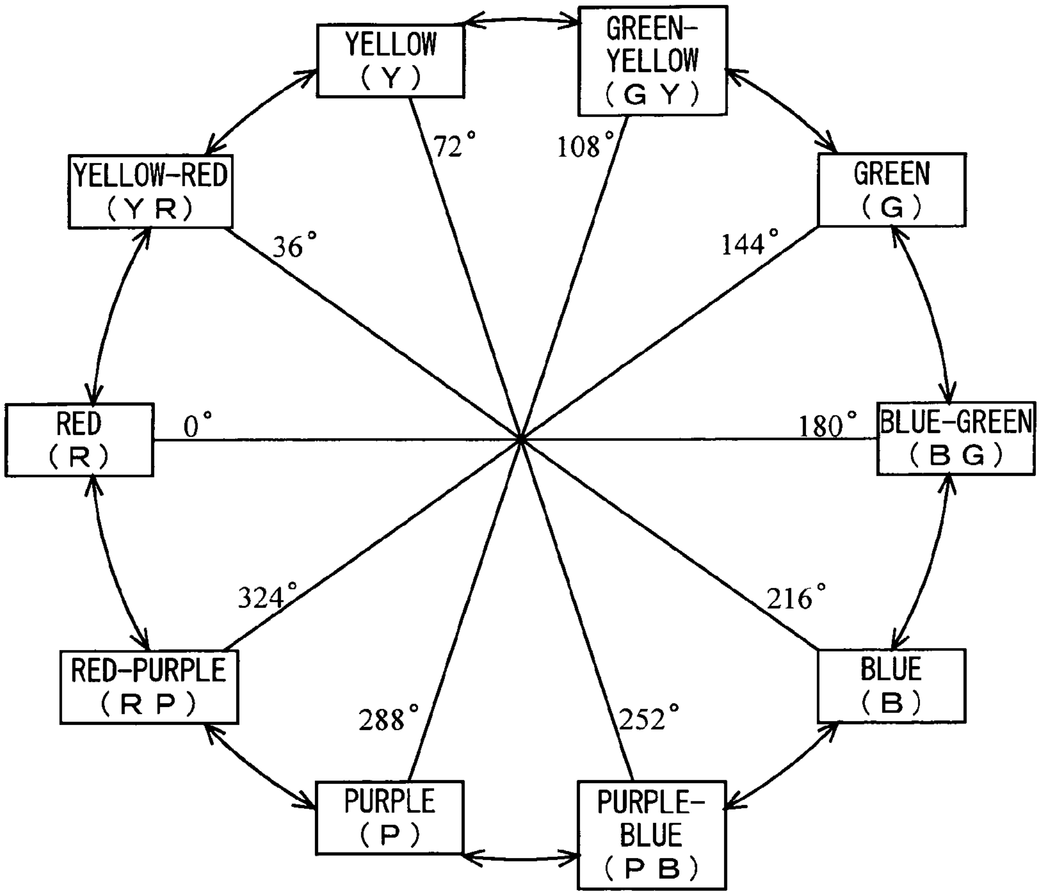
FIG. 4 is a view showing an example of a hue circle used in the color conversion program according to the embodiment.
Figure 5:
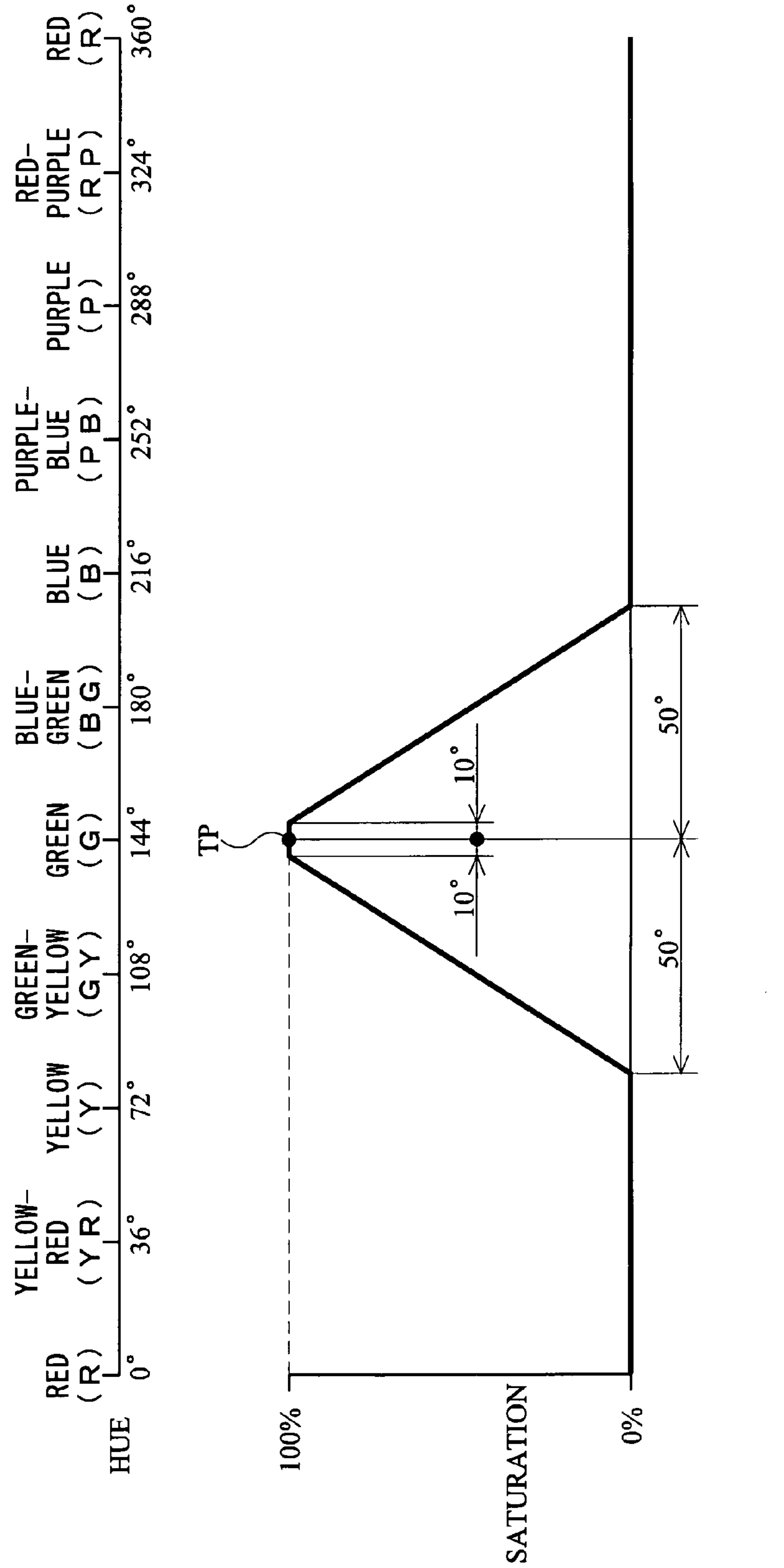
FIG. 5 is a view showing an example of a hue range determined as a conversion target with respect to a touch position TP, and an example of changing saturation with respect to the conversion target.
Figure 6:
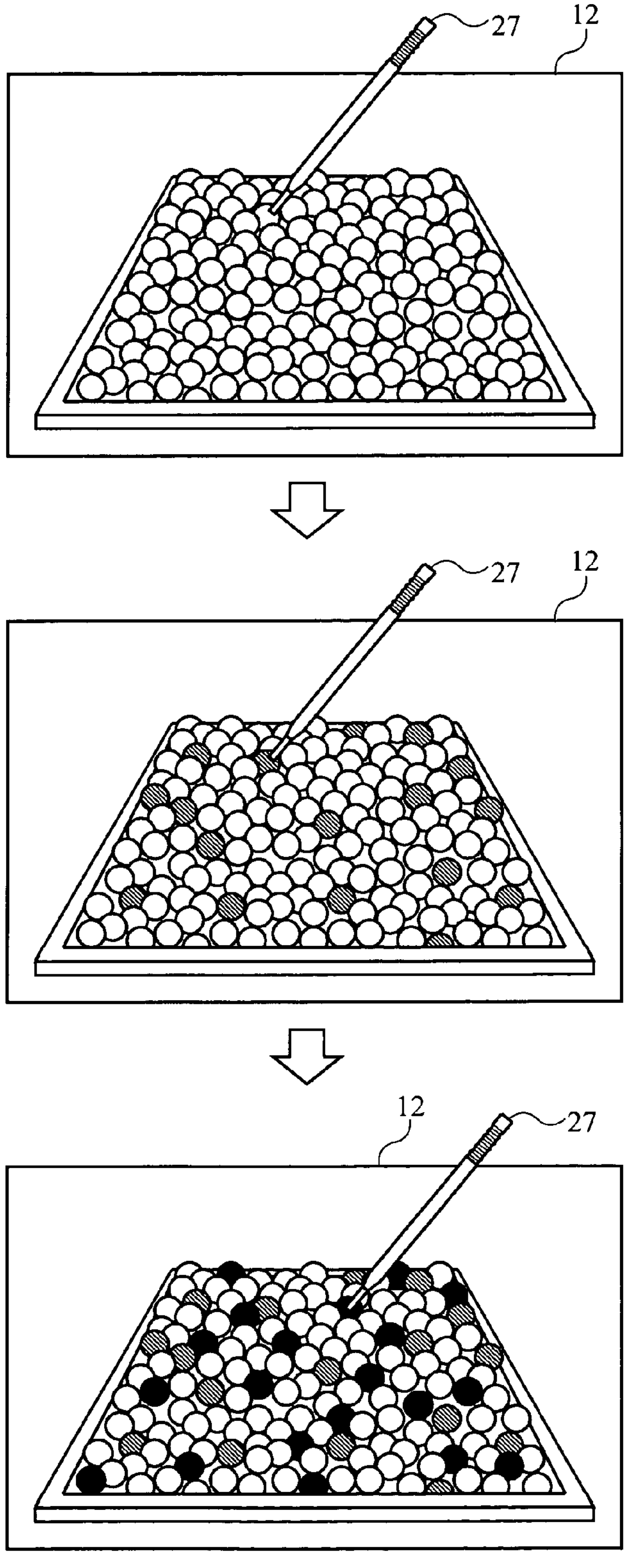
FIG. 6 is a view showing another example of the screen display which is displayed on the lower LCD 12 of FIG. 1 and color-converted.
Figure 7:
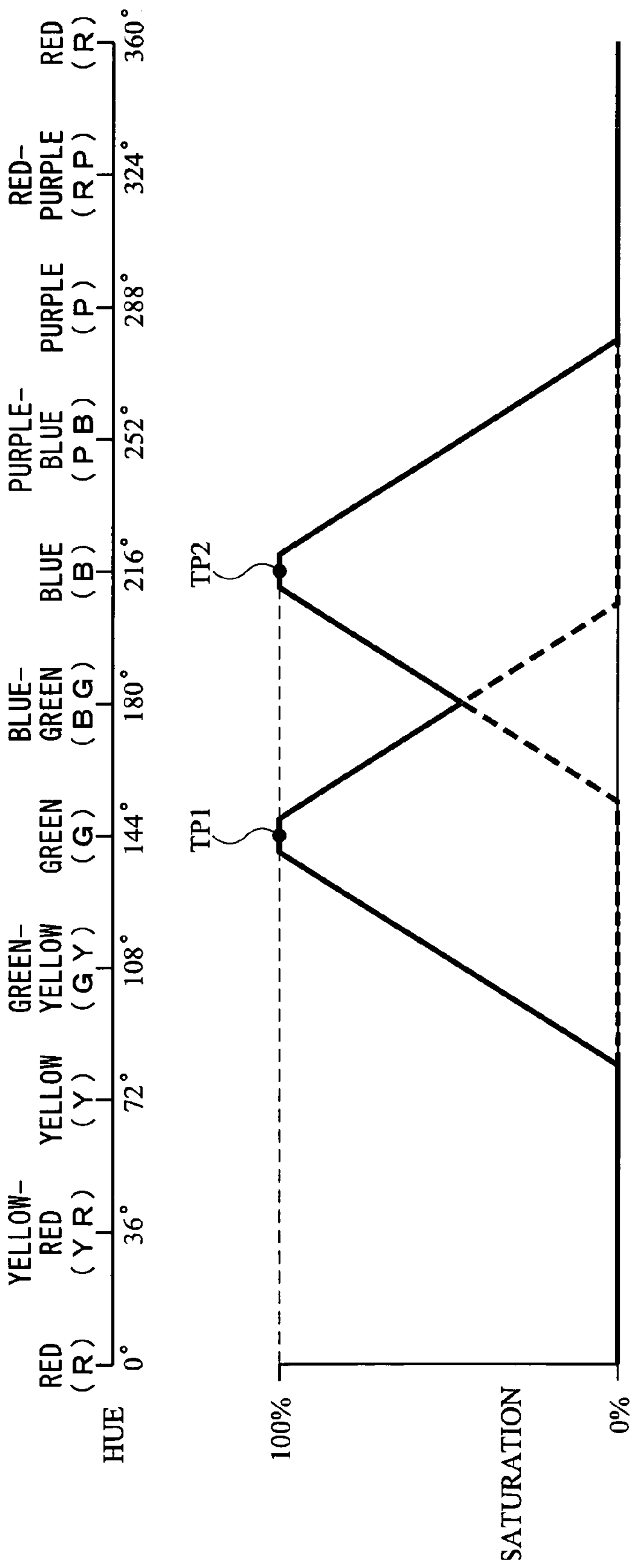
FIG. 7 is a view showing an example of hue ranges determined as conversion targets with respect to a plurality of touch positions TP1 and TP2, and an example of changing saturation with respect to the conversion targets.

Prior to description of a concrete processing operation by the color conversion program executed by the game apparatus 1, with reference to FIGS. 3 to 7, the following will describe an example of a display form displayed on the lower LCD 12 and/or the upper LCD 22 by the processing operation. FIG. 3 is a view showing an example of a screen display which is displayed on the lower LCD 12 and color-converted. FIG. 4 is a view showing an example of a hue circle used in the color conversion program. FIG. 5 is a view showing an example of a hue range determined as a conversion target with respect to a touch position TP and an example of changing saturation (chroma) with respect to the conversion target. FIG. 6 is a view showing another example of the screen display which is displayed on the lower LCD 12 and color-converted. FIG. 7 is a view showing an example of hue ranges determined as conversion targets with respect to a plurality of touch positions TP1 and TP2 and an example of changing saturation with respect to the conversion targets.

As shown in FIG. 3, a real-time image (a taken image) taken by the inner camera 23 or the outer camera 25 is displayed on the lower LCD 12 of the game apparatus 1. In the present embodiment, the taken image is a chromatic image, but a display image obtained by changing the taken image into a monochrome image (namely, an achromatic image obtained by changing saturation of all pixels of the taken image into 0) is displayed once on the lower LCD 12 (an upper diagram in FIG. 3). Then, saturation of the display image is changed in accordance with a hue of a pixel of the taken image corresponding to a touch position at which a touch operation is performed with respect to the touch panel 13, and a resultant image is displayed on the lower LCD 12 (a lower diagram in FIG. 3).

The upper diagram in FIG. 3 shows an example in which a monochrome image obtained by changing saturation of each pixel of the taken image, which is the chromatic image, to 0 is displayed on the lower LCD 12. In the present embodiment, by performing a touch operation at a position on the monochrome image displayed on the lower LCD 12, color is added to only pixels having hues in the vicinity of a hue which is the same as a hue of the taken image corresponding to the position, and an resultant image is displayed on the lower LCD 12. For example, in the upper diagram in FIG. 3, in the monochrome image disclosed on the lower LCD 12, the user performs a touch operation at a position at which green is originally expressed in imaging. The lower diagram in FIG. 3 shows a state in which a display image obtained by adding originally expressed green to only portions of the monochrome image at which green is originally expressed in imaging (portions of leaves of trees in the lower diagram in FIG. 3) in accordance with the touch operation.

More specifically, when the user performs a touch operation with respect to the monochrome image displayed on the lower LCD 12, a color (e.g. an RGB value) of a pixel of the taken image, from which the monochrome image is generated, corresponding to a position at which the touch operation is performed is detected. Then, a hue corresponding to the detected color of the pixel is calculated, and a predetermined range having the hue at a center thereof is set as a color conversion target. Saturation for the hue which is the color conversion target is changed to a value larger than 0. Thus, pixels having the hue which is the color conversion target is changed from a monochromatic color to a chromatic color, and an image in which color is added naturally such that a color at the position at which the user performs the touch operation is changed to an originally expressed color is displayed on the lower LCD 12.

In calculating the hue corresponding to the detected color of the pixel and setting the predetermined range having the hue at the center thereof, for example, a hue circle is used as shown in FIG. 4. FIG. 4 shows an example of using the Munsell hue circle. The Munsell hue circle divides into five principal hues (red, yellow, green, blue, purple) and intermediate hues halfway between the adjacent principal colors (yellow-red, green-yellow, blue-green, purple-blue, red-purple), namely, a total of 10 hues, further divides between these hues, and arranges these hues in a circle. For example, in the present embodiment, for the hue (e.g. green) corresponding the detected color of the pixel, a predetermined angular range (e.g. 50 degrees before and after the hue) having the hue at a center thereof in the Munsell hue circle is set as a color conversion target.

In the Munsell hue circle, hue dividing intervals are equal to each other. Thus, even a selected hue is either color, it is easy to set a range having the hue at a center thereof. However, if such an effect is not expected, another hue circle may be used. For example, another color system, such as a PCCS (Practical Color Coordinate System), an Ostwald color system, an NCS (Natural Color System), an XYZ color system, or the like, may be used. In certain example embodiments, various color systems using at least hue as an attribute for expressing color can be used.

With reference to FIG. 5, the following will describe an example of changing saturation with respect to the set color conversion target. FIG. 5 shows an example of the color conversion target which is set using the above Munsell hue circle, and an example of changing saturation with respect to the color conversion target.

For example, it is assumed that the hue of the pixel of the taken image corresponding to the touch position TP by the user is green. In this case, a color conversion range is set so as to have a hue "green" at a center thereof and so as to have 50 degrees before and after the hue "green" in the Munsell hue circle (namely, a range of a total of 100 degrees). The set color conversion range is divided into a range in which a rate of returning saturation to original saturation (hereinafter, referred to as a saturation reproduction rate) is 100% and a range in which the saturation reproduction rate is changed so as to be gradually decreased from 100% to 0%. The saturation reproduction rate is a rate of saturation of a monochromatic display image with respect to saturation of an original image (namely, a chromatic taken image), and saturation which is larger than saturation of the original image is not set. In other words, a saturation reproduction rate of 100% in color conversion means to change saturation of pixels of the color conversion target which are set to 0 in the monochromatic display image to saturation of the pixels in the original image to display a resultant image. Changing saturation at a saturation reproduction rate of 50% in color conversion means to change the saturation of the pixels of the color conversion target to half (50%) of the saturation of the pixels in the original image to display a resultant image. For example, when a hue corresponding to a touch position TP is "green", a range between 5 degrees before and after the hue in the Munsell hue circle (namely, a range of a total of 10 degrees) is set to a range in which the saturation reproduction rate is 100%. Further, when the hue corresponding to the touch position TP is "green", ranges from 5 to 50 degrees before and after the hue in the hue are set to ranges in which the saturation reproduction rate is changed so as to be gradually decreased from 100% to 0%. In other words, saturation with respect to the range between 5 degrees before and after the detected hue corresponding to the touch position TP is changed at a saturation reproduction rate of 100%, and the saturation reproduction rate is gradually decreased as the hue is distance therefrom. More specifically, as shown in FIG. 5, from a hue 5 degrees away from the selected hue to a hue 50 degrees away from the selected hue in the Munsell hue circle, the saturation is set so as to be linearly changed at a saturation reproduction rate of 100% to 0%.

As described above, by gradually decreasing the saturation, it is possible to express an image such that a color originally obtained in imaging is added naturally to the monochrome image. Further, the user can easily generate an image in which a desired color is added only by performing a touch operation at one position with respect to the display image displayed on the lower LCD 12. Further, the hue which is selected in accordance with the touch operation is set at a center, and the saturation is set so as to be decreased in a phased manner. Thus, noise can be reduced in performing color conversion, and it is possible to convert into an image in which the color at the position at which the touch operation is performed is naturally added.

With reference to FIGS. 6 and 7, an example when the user performs a touch operation at a plurality of positions with respect to the monochrome image displayed on the lower LCD 12 is described.

An upper diagram in FIG. 6 shows another example in which a monochrome image obtained by changing saturation of each pixel of the taken image, which is the chromatic image, to 0 is displayed on the lower LCD 12. More specifically, in the upper diagram in FIG. 6, an image of color balls of various colors is taken, and a monochrome image generated from the taken image is displayed on the lower LCD 12. For example, in the upper diagram in FIG. 6, in the monochrome image displayed on the lower LCD 12, the user performs a touch operation with respect to a color ball whose image is taken originally in green. A middle diagram in FIG. 6 shows a state in which a display image obtained by adding originally expressed green only to portions (color balls of green which are indicated by slant line regions in the middle diagram in FIG. 6) of the monochrome image whose images are originally taken in green is displayed on the lower LCD 12 in accordance with the touch operation.

Further, in a lower diagram in FIG. 6, in a display image obtained by adding color only to pixels of the monochrome image displayed on the lower LCD 12 which have hues in the vicinity of green which is originally obtained in imaging, the user further performs a touch operation with respect to a color ball whose image is taken originally in blue. The lower diagram in FIG. 6 shows a state in which a display image obtained by adding originally expressed blue to portions (color balls of blue which are indicated by filled regions in the lower diagram in FIG. 6) whose images are originally taken in blue, in addition to the portions of the monochrome image whose images are taken originally in green, is displayed on the lower LCD 12 in accordance with the touch operation. Thus, when the user performs a touch operation at a plurality of positions with respect to the monochrome image displayed on the lower LCD 12, color is added to pixels having a hue (green and blue in the example in FIG. 6) in the vicinity of a hue which is the same as a hue of the taken image corresponding to each touch position, and a resultant image is displayed on the lower LCD 12. Thus, the user can easily generate an image in which a plurality of colors are added in accordance with the touch operation only by performing a touch operation at a plurality of positions with respect to the display image displayed on the lower LCD 12.

More specifically, as shown in FIG. 7, it is assumed that a hue of a pixel of the taken image corresponding to a first touch position TP1 by the user is green. In this case, a first color conversion range is set so as to have the hue "green" at a center thereof similarly as in FIG. 5 and so as to have 50 degrees before and after the hue "green" in the Munsell hue circle. Further, a saturation reproduction rate for the first color conversion range is the same as that in the example described with reference to FIG. 5, and thus the detail description thereof will be omitted.

Next, it is assumed that a hue of a pixel of the taken image corresponding to a second touch position TP2 of the user is blue. In this case, a second color conversion range is set so as to have a hue "blue" at a center thereof similarly as the first color conversion range and so as to have 50 degrees before and after the hue "blue" in the Munsell hue circle. The set second color conversion range is divided into a region in which saturation is changed at a saturation reproduction rate of 100% and a region in which saturation is changed so as to be gradually decreased at a saturation reproduction rate changed of 100% to 0%. In other words, when the hue corresponding to the touch position TP2 is "blue", a range between 5 degrees before and after the hue in the Munsell hue circle are set to a range in which saturation is changed at a saturation reproduction rate of 100%, and ranges from 5 to 50 degrees before and after the hue are set to ranges in which saturation is changed so as to be gradually decreased at a saturation reproduction rate of 100% to 0%.

Here, as shown in FIG. 7, where a hue "red" in the Munsell hue circle is set at a circle angular position of 0 degree, the hue "green" is set at a circle angular position of 144 degrees, and the hue "blue" is set at a circle angular position of 216 degrees. In other words, as shown in FIG. 7, the first color conversion range set for the hue "green" partially overlaps with the second color conversion range set for the hue "blue". In this case, in a range where the color conversion ranges overlaps with each other, a higher saturation reproduction rate is selected among saturation reproduction rates set for the color conversion ranges (see FIG. 7). Thus, by combining saturation reproduction rates set for a plurality of color conversion ranges, the saturation reproduction rates are smoothly connected in a range where the plurality of color conversion ranges overlap with each other, thereby enabling color conversion processing to be performed without an uncomfortable feeling.

Figure 8:
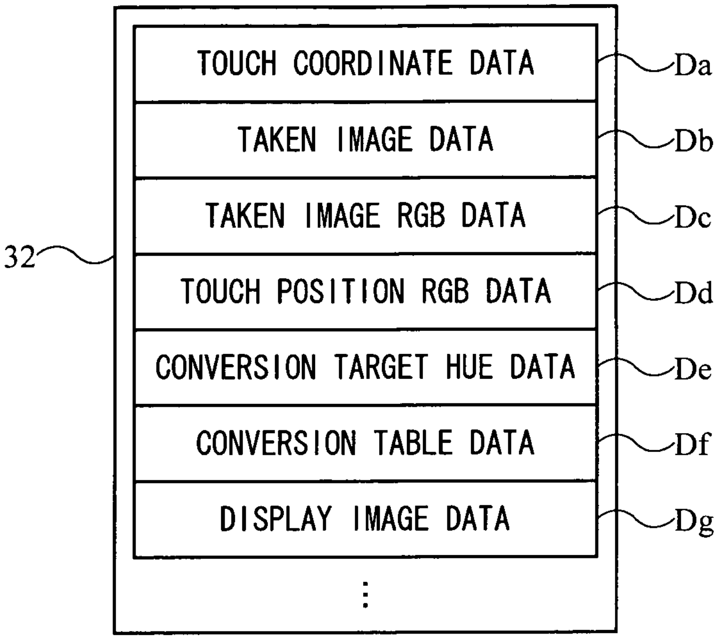
FIG. 8 is a view showing an example of various data stored in a main memory 32 in accordance with execution of the color conversion program according to the embodiment.
Figure 9:
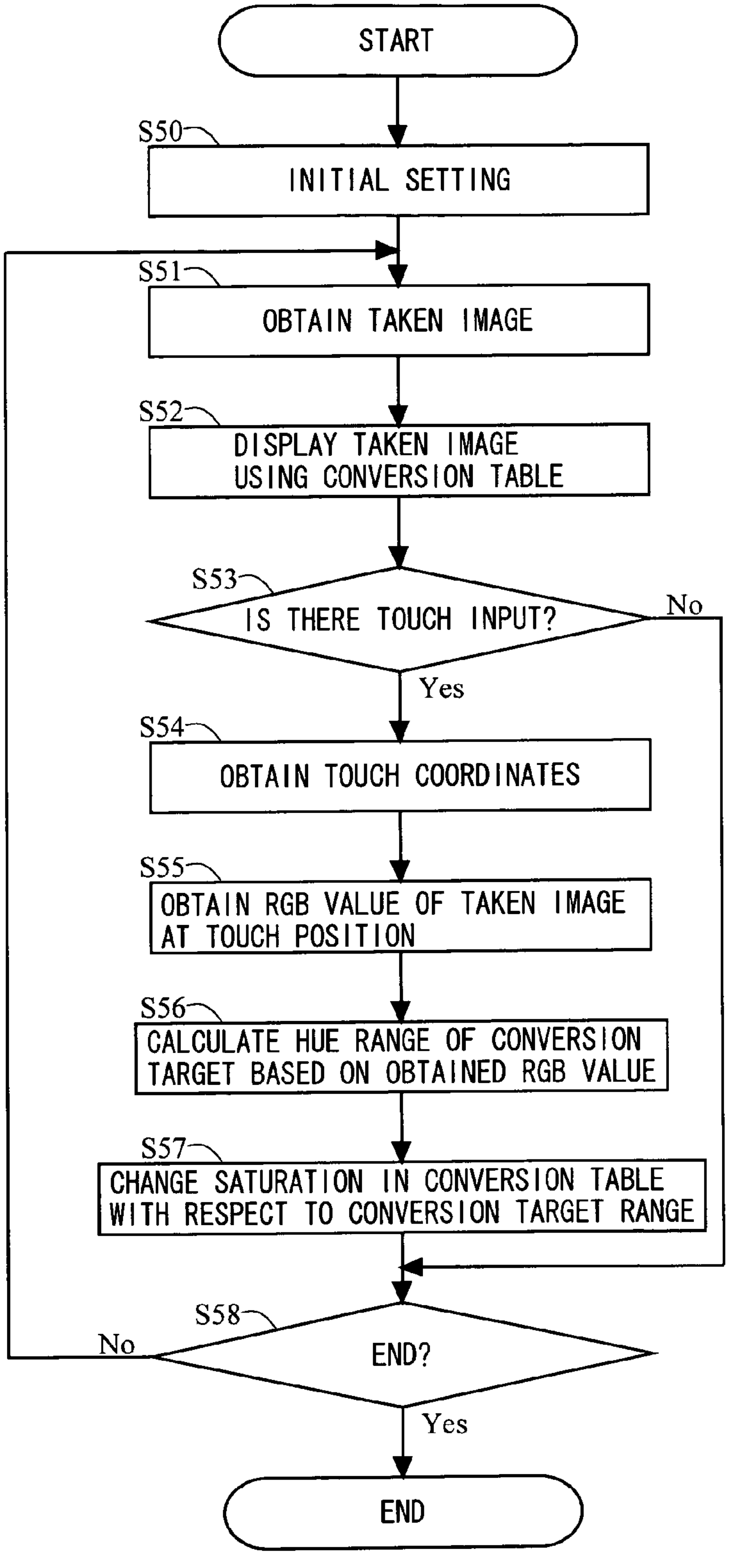
FIG. 9 is a flow chart of color conversion processing executed by the game apparatus 1 executing the color conversion program according to the embodiment.

With reference to FIGS. 8 and 9, the following will describe a concrete processing operation by the color conversion program executed by the game apparatus 1. FIG. 8 is a view showing an example of various data stored in the main memory 32 in accordance with execution of the color conversion program. FIG. 9 is a flow chart of the color conversion processing executed by the game apparatus 1 executing the color conversion program. A program for executing these processing is included in a program stored in the memory card 28 or the memory card 29, and read out from the memory card 28 or the memory card 29 via the memory card I/F 36 into the main memory 32 to be executed by the CPU 31 when the power of the game apparatus 1 is turned on.

As shown in FIG. 8, programs read out from the memory card 28 and the memory card 29, and temporal data generated in the color conversion processing are stored in the main memory 32. As shown in FIG. 8, in a data storage region of the main memory 32, touch coordinate data Da, taken image data Db, taken image RGB data Dc, touch position RGB data Dd, conversion target hue data De, conversion table data Df, display image data Dg, and the like are stored.

In the touch coordinate data Da, data of touch coordinates indicative of a touch position TP in a screen coordinate system at which a player touches the touch panel 13 is stored. For example, touch coordinates are obtained at intervals of a time unit at which the game apparatus 1 performs a game process (e.g. every 1/60 sec.), and accordingly, data indicative of the touch coordinates is stored in the touch coordinate data Da for updating the touch coordinate data Da.

In the taken image data Db, data of a real-time image taken by the inner camera 23 or the outer camera 25 is stored. For example, an image is taken by the inner camera 23 or the outer camera 25 at intervals of a predetermined time unit (e.g. every 1/60 sec.), and accordingly, data of the taken image is stored in the taken image data Db for updating the taken image data Db. In the taken image RGB data Dc, data indicative of an RGB value of each pixel of the image taken by the inner camera 23 or the outer camera 25 is stored.

In the touch position RGB data Dd, data indicative of an RGB data of a pixel of the taken image corresponding to a touch position TP is stored. For example, in accordance with a touch position TP at which a touch-on is performed with respect to the touch panel 13, a pointed position which is designated in a display image displayed on the lower LCD 12 (e.g. a position to which the touch position TP is perspectively projected in the display image) is calculated. Then, a pixel corresponding to the calculated pointed position is extracted, and data indicative of an RGB value of the pixel is stored in the touch position RGB data Dd.

In the conversion target hue data De, data indicative of the aforementioned color conversion range is stored. For example, a hue corresponding to the RGB value at the touch position TP which is stored in the touch position RGB data Dd is calculated, and data indicative of a predetermined range (a color conversion range) having the hue at a center thereof is stored in the conversion target hue data De.

In the conversion table data Df, data indicative of a conversion table used in converting an image taken by the inner camera 23 or the outer camera 25 into a display image to be displayed on the lower LCD 12 is stored. For example, in the conversion table, data indicative of a color which corresponds to an RGB value and is to be displayed on the lower LCD 12 is stored. More specifically, a hue, brightness (value), and saturation which correspond to each RGB value are described in the conversion table, and an RGB value of each pixel of the taken image is converted into a color described in the conversion table to generate a display image. In the display image data Dg, data indicative of the display image obtained by conversion with the conversion table is stored.

With reference to FIG. 9, the following will describe an operation of the game apparatus 1. When the power (the power button 14F) of the game apparatus 1 is turned on, a boot program (not shown) is executed by the CPU 31 to load the color conversion program stored in the memory card 28 or 29 into the main memory 32. By the CPU 31 executing the loaded color conversion program, steps shown in FIG. 9 (abbreviated as "S" in FIG. 9) are executed. A processing loop of steps 51 to 58 shown in FIG. 9 is executed every a predetermined time period (e.g. every 1/60 sec.).

As shown in FIG. 9, the CPU 31 performs initial setting for the color conversion processing (a step 50), and advances the processing to the next step. For example, as the initial setting executed at the step 50, the CPU 31 initializes each of parameters stored in the main memory 32 to a predetermined value. For example, the conversion table stored in the conversion table data Df is initialized to a table in which a color for each RGB value is converted into a color having a saturation value of 0 (namely, an achromatic color).

Next, the CPU 31 obtains data of a real-time image taken by the inner camera 23 or the outer camera 25 (the step 51), and advances the processing to the next step. For example, at the step 51, a chromatic image is taken in real time by one of the inner camera 23 and the outer camera 25, and the taken image data Db and the taken image RGB data Dc are updated with data indicative of an RGB value of each pixel of the taken image, and the like.

Next, the CPU 31 converts a color of each pixel of the taken image with the conversion table to display a resultant image on the lower LCD 12 (the step 52), and advances the processing to the next step. For example, the CPU 31 converts the RGB value of each pixel of the taken image which is stored in the taken image RGB data Dc into a color stored in the conversion table data Df with the conversion table to generate a display image, and updates the display image data Dg with the display image. Then, the CPU 31 displays the display image stored in the display image data Dg on the lower LCD 12. For example, when the conversion table stored in the conversion table data Df is in an initial state (namely, in a set state in which a color for each RGB value is converted into a color having a saturation value of 0, the chromatic taken image is converted into an achromatic (monochrome) display image, and displayed on the lower LCD 12.

Next, the CPU 31 determines whether or not a touch input has been performed with respect to the touch panel 13 (the step 53). When the touch input has been performed, the CPU 31 advances the processing to the next step 54. On the other hand, when the touch input has not been performed, the CPU 31 advances the processing to the step 58.

At the step 54, the CPU 31 obtains touch coordinates indicative of a touch position TP in the screen coordinate system at which the touch panel 13 has been touched, and advances the processing to the next step. For example, the CPU 31 updates the touch coordinates stored in the touch coordinate data Da with the obtained touch coordinates.

Next, the CPU 31 obtains an RGB value of the taken image corresponding to the touch position TP obtained at the step 54 (the step 55), and advances the processing to the next step. For example, the CPU 31 calculates a pointed position which is designated in the display image displayed on the lower LCD 12 (e.g. a position to which the touch position TP is perspectively projected in the display image) in accordance with the touch position TP. Then, the CPU 31 refers to the taken image RGB data Dc, extracts a pixel of the taken image corresponding to the calculated pointed position, and updates the touch position RGB data Dd with data indicative of the RGB value of the pixel.

Next, the CPU 31 calculates a conversion target range based on the RGB value obtained at the step 55 (the step 56), and advances the processing to the next step. For example, the CPU 31 converts the RGB value obtained at the step 55 into a hue, and calculates a predetermined circle angular range having the hue at a center thereof in the Munsell hue circle (see FIG. 4) as a conversion target range (see FIGS. 5 and 7). Then, the CPU 31 updates the conversion target hue data De with the calculated conversion target range.

Next, the CPU 31 changes saturation in the conversion table with respect to the conversion target range calculated at the step 56 (the step 57), and advances the processing to the next step. For example, the CPU 31 sets a range between 5 degrees before and after the hue at the center of the conversion target range to a range in which saturation is changed at a saturation reproduction rate of 100%, and sets ranges from 5 to 50 degrees before and after the hue to ranges in which saturation is changed so as to be gradually decreased at a saturation reproduction rate of 100% to 0% (see FIG. 5). Then, the CPU 31 sets a range in the conversion table in which hues within the conversion target range are described as a target whose saturation is to be changed, and changes saturation of colors described in the conversion table at the saturation reproduction rates according to the described hues to update the conversion table data Df.

When the step 57 is executed a plurality times for different hues, in a state where the saturation which is changed the last time is valid, the saturation is changed and written in the conversion table for each of hues which newly become change targets. Thus, a region in the conversion table in which saturation is set to a value other than 0 is increased every time the processing is performed. Further, when a hue which is a change target is a hue for which saturation of a color has been set to a value other than 0 (namely, a chromatic color), the CPU 31 selects a higher saturation reproduction rate, and changes the saturation for the hue at the selected saturation reproduction rate (see FIG. 7). As described above, by the processing at the step 57, the conversion table is updated with a conversion table in which saturation for the predetermined range having at the center thereof the hue corresponding to the position at which the touch operation is performed is changed to saturation larger than 0 to have a chromatic color. Then, by executing the step 52 after the update of the conversion table, the taken image in which hues within the predetermined range having at the center thereof the hue corresponding to the position at which the touch operation is performed are added is displayed on the lower LCD 12.

Next, the CPU 31 determines whether or not to terminate the color conversion processing (the step 58). A condition for terminating the color conversion processing includes, for example, satisfaction of conditions to terminate the color conversion processing, an operation performed by the user for terminating the color conversion processing, and the like. When not terminating the color conversion processing, the CPU 31 returns to the step 51, and repeats the processing. When terminating the color conversion processing, the CPU 31 terminates the processing by the flow chart.

As described above, the game apparatus 1 according to the present embodiment is capable of performing color conversion desired by the user only by the user once touching an image displayed on the lower LCD 12 at a position at which a color desired by the user is originally expressed. Further, when a color conversion target is limited only to a hue of a pixel overlapping with a position at which a touch operation is performed and color conversion is performed, it is considered that a significantly limited region (in an extreme case, only a pixel overlapping with a touch position) is color-converted in a display image, and color conversion desired by the user cannot be performed. On the other hand, it is rare that the user desires to color-convert only a hue at a position at which a touch operation is performed, and generally, the user desires hues adjacent to the hue to some extent to be color conversion targets. The game apparatus 1 according to the present embodiment sets not only a hue according to the touch operation but also hues within a predetermined range having the hue at a center thereof as a range of a color conversion target. Thus, by setting the hues within the predetermined range as color conversion targets, hues slightly away from a hue of a pixel overlapping with the touch position can be color conversion targets, thereby enabling color conversion desired by the user to be performed.

In the above description, as shown in FIG. 5, from a hue 5 degrees away from the hue which is selected in accordance with the touch position TP to a hue 50 degrees away from the hue in the Munsell hue circle, saturation is set so as to be decreased from 100% to 0% at a linear rate. However, in this range, saturation may be decreased from 100% to 0% in another manner. For example, from the hue 5 degrees away from the hue which is selected in accordance with the touch position TP to the hue 50 degrees away from the hue in the Munsell hue circle, the saturation may be set so as to be decreased from 100% to 0% at a curved rate using a quadratic. function curve, a cubic function curve, a sine curve, a cosine curve, a spline interpolation, or the like. As described above, by setting the saturation so as to be gradually decreased in a linear or curved manner with the hue which is selected in accordance with the touch operation set at a center, noise can be reduced in performing color conversion, and it is possible to convert into an image in which a color at the position at which the user performs the touch operation is added naturally.

As described with reference to FIG. 7, in the range where the color conversion ranges overlap with each other, a higher saturation reproduction rate is selected among the saturation reproduction rates set for the color conversion ranges to combine the saturation reproduction rates. However, the saturation reproduction rates may be combined in another manner. For example, in accordance with a circle angular distance between a plurality of color conversion ranges (e.g. an angle of 72 degrees from the hue "green" to the hue "blue" in the example in FIG. 7), the saturation reproduction rates in the overlapping range may be smoothly connected in a curved manner. For example, the saturation reproduction rates are connected so as to vary in a curved manner such that a center of the overlapping range becomes minimum to combine the saturation reproduction rates. Thus, even when the saturation reproduction rates set for a plurality of color conversion ranges are complemented in a curved manner to be combined, the saturation reproduction rates in the overlapping range of the plurality of color conversion ranges are smoothly connected, thereby enabling color conversion processing to be performed without an uncomfortable feeling.

Further, in the color conversion operation described above, the RGB value corresponding to the touch position TP is obtained using the pixel of the taken image corresponding to the pointed position. However, the RGB value corresponding to the touch position TP may be obtained using a plurality of pixels of the taken image in the vicinity of the pointed position. For example, in accordance with a touch position TP at which the user performs a touch operation with respect to the touch panel 13, a pointed position which is designated in a display image displayed on the lower LCD 12 (e.g. a position to which the touch position TP is perspectively projected in the display image) is calculated. Then, referring to the taken image RGB data Dc, pixels of the taken image within a predetermined distance from the calculated pointed position are extracted, and a representative RGB value for these pixels is calculated using data indicative of RGB values of these pixels. Here, the representative RGB value is an RGB value indicative of a main color in the pixels of the taken image within the predetermined distance from the pointed position. As an example, among RGB values set for the pixels of the taken image within the predetermined distance from the pointed position, an RGB value which is set most frequently is set as the representative RGB value. As another example, an average of the RGB values set for the pixels of the taken image within the predetermined distance from the pointed position is set as the representative RGB value. As described above, by obtaining the representative RGB value as the RGB value corresponding to the touch position TP, an effect of noise generated in the pixel of the taken image corresponding to the pointed position, and the like can be eliminated, and a color desired by the user can be set as a color conversion target.

Further, in the above description, the hues within the predetermined range having at a center thereof the hue according to the touch operation performed by the user with respect to the image displayed on the lower LCD 12 are set as a range of the color conversion target. Color conversion processing of increasing saturation is performed for pixels having the hues within the range. However, other color conversion processing may be performed for the pixels.

As a first example, color conversion processing of decreasing saturation is performed for the pixels having the hues within the range of the color conversion target. In this case, a real-time chromatic image taken by the inner camera 23 or the outer camera 25 (typically, a display image which is a taken image without change) is displayed on the lower LCD 12, and hues within a predetermined range having at a center thereof a hue according to a touch operation performed by the user with respect the chromatic image are set as a range of the color conversion target. Then, color conversion processing of decreasing saturation is performed for pixels having the hues within the range, whereby the taken image in which only a color selected by the user is changed to a monochrome color is displayed on the lower LCD 12.

As a second example, color conversion processing of increasing brightness is performed for the pixels having the hues within the range of the color conversion target. In this case, a display image obtained by changing brightness of all pixels of a real-time image taken by the inner camera 23 or the outer camera 25 to 0 (namely, a black image whose surface is filled with black) is displayed on the lower LCD 12. Then, a hue of the taken image according to a touch operation performed by the user with respect to the black image displayed on the lower LCD 12 is extracted, and hues within a predetermined range having the hue at a center thereof are set as a range of the color conversion target. Next, the color conversion processing of increasing brightness is performed for pixels having the hues within the range, whereby the taken image in which only a color selected by the user appears on the black image is displayed on the lower LCD 12.

As a third example, color conversion processing of decreasing brightness is performed for the pixels having the hues within the range of the color conversion target. In this case, a real-time chromatic image taken by the inner camera 23 or the outer camera 25 (typically, a display image which is a taken image without change) is displayed on the lower LCD 12, and hues within a predetermined range having at a center thereof a hue according to a touch operation performed by the user with respect the chromatic image are set as a range of the color conversion target. Then, the color conversion processing of decreasing brightness is performed for the pixels having the hue within the range, whereby the taken image in which only a color selected by the user is changed to a dark color is displayed on the lower LCD 12.

As a fourth example, color conversion processing of sequentially changing hue is performed for the pixels having the hues within the range of the color conversion target. In this case, a real-time chromatic image taken by the inner camera 23 or the outer camera 25 (typically, a display image which is a taken image without change) is displayed on the lower LCD 12, and hues within a predetermined range having at a center thereof a hue according to a touch operation performed by the user with respect the chromatic image are set as a range of the color conversion target. Then, for pixels having the hues within the range, the hues are changed sequentially as time passes. Thus, by performing the color conversion processing of sequentially changing hue, the taken image in which only a color selected by the user is gradually changed is displayed on the lower LCD 12.

Figure 10:
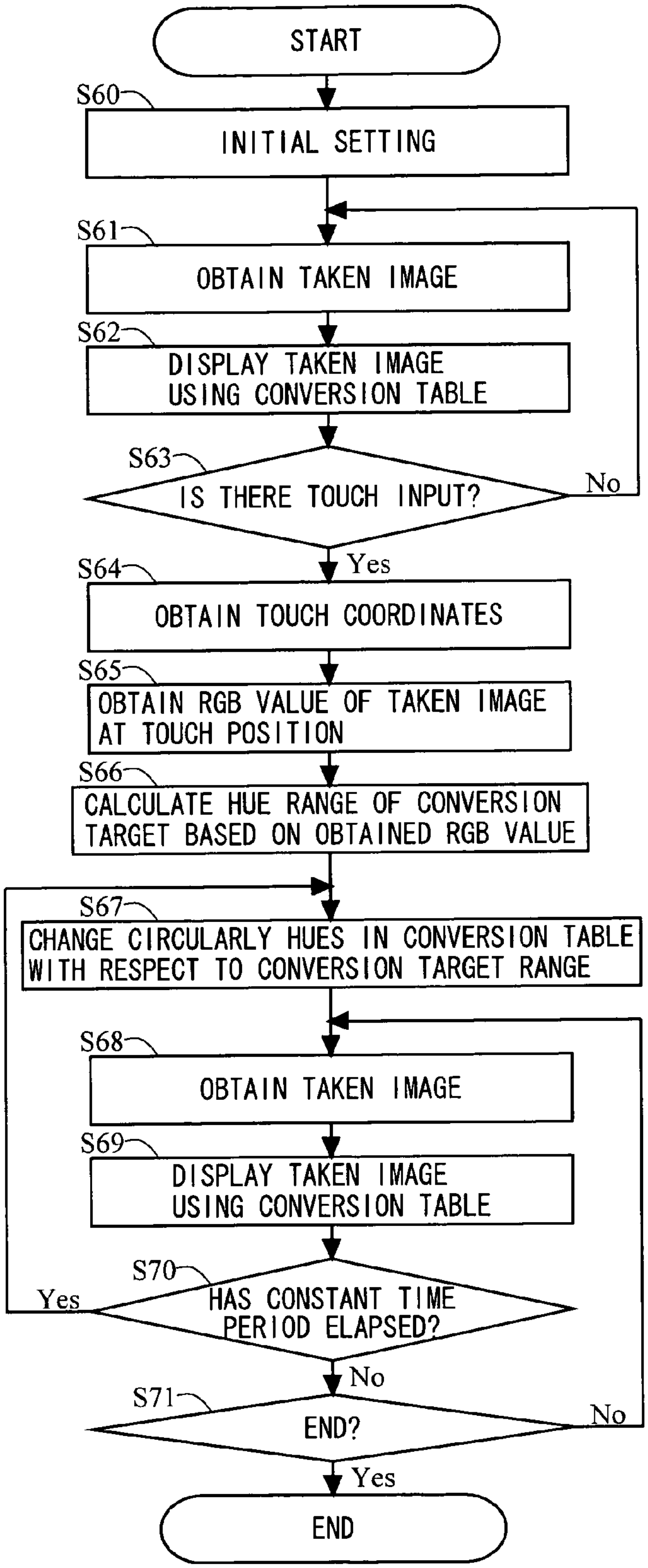
FIG. 10 is a flow chart showing another example of the color conversion processing executed by the game apparatus 1 executing the color conversion program according to the embodiment.

For example, the color conversion processing in the fourth example can be performed by the game apparatus 1 executing color conversion processing of a flow chart shown in FIG. 10. In FIG. 10, at steps 60 to 66, the CPU 31 executes the same processing as those at the above steps 50 to 56 to calculate a hue range of the conversion target.

Then, the CPU 31 circularly changes hues in the conversion table with respect to the conversion target range calculated at the step 66 (a step 67), and advances the processing to the next step 68. For example, the CPU 31 sequentially changes the hues within the conversion target range in order of a forward direction of hues arranged in the Munsell hue circle (namely, in order of red, yellow-red, yellow, green-yellow, green, blue-green, blue, purple-blue, purple, red-purple, and red) or in order of a reverse direction.

At steps 68 and 69, the CPU 31 executes the same processing as those at the above steps 51 and 52. Next, the CPU 31 determines whether or not a predetermined constant time period has elapsed (a step 70). When the constant time period has elapsed, the CPU 31 returns to the step 67, and repeats the processing. On the other hand, when the constant time period has not elapsed, the CPU 31 determines whether to terminate the color conversion processing similarly at the step 58. When not terminating the color conversion processing, the CPU 31 returns to the step 58, and repeats the processing. When terminating the color conversion processing, the CPU 31 terminates the processing by the flow chart.

As a fifth example, color conversion processing of changing hue in accordance with a color conversion relational expression is performed for the pixels having the hues within the range of the color conversion target. In this case, a real-time chromatic image taken by the inner camera 23 or the outer camera 25 (typically, a display image which is a taken image without change) is displayed on the lower LCD 12, and hues within a predetermined range having at a center thereof a hue in accordance with a touch operation performed by the user with respect the chromatic image are set as a range of the color conversion target. Then, for pixels having the hues within the range, the hues are changed to predetermined hues (e.g. changed to hues having diagonal relationships in the Munsell hue circle, or hues away therefrom by a predetermined circle angle in the Munsell hue circle).

Figure 11:
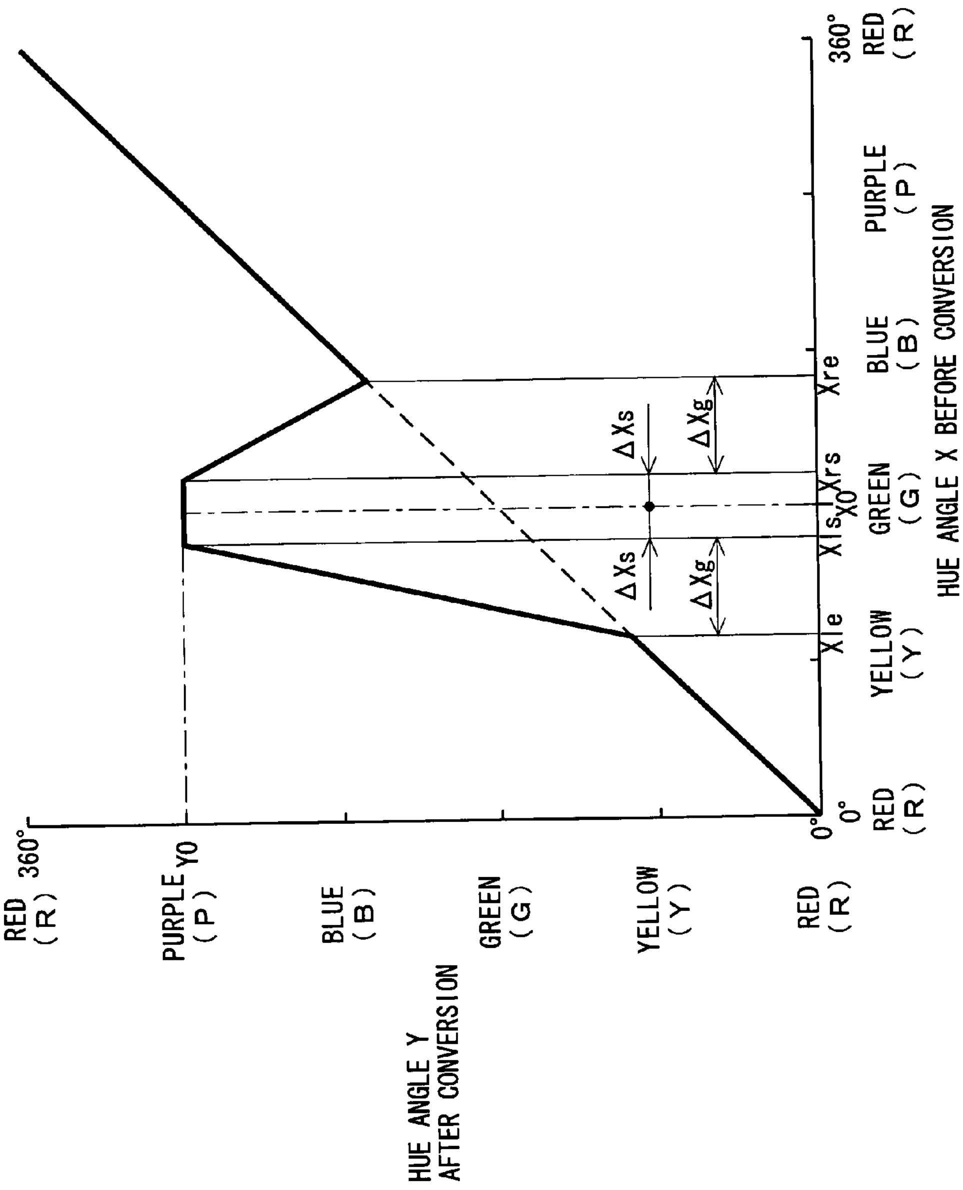
FIG. 11 is a view showing an example of a color conversion target which is set using a Munsell hue circle and an example of changing a hue with respect to the color conversion target.

Here, when the hues are changed to hues away therefrom by the predetermined circle angle in the Munsell hue circle, it is possible to perform color conversion without an uncomfortable feeling by performing color conversion which provides smooth connection between changed hues and unchanged hues. For example, similarly as the above change of the saturation reproduction rate, the set color conversion target range is set to have a range in which hues before conversion are changed to predetermined hues (referred to as conversion target hues) and a range in which hues before conversion are changed so as to be gradually increased to be close to the conversion target hues. With reference to FIG. 11, the following will describe an example of changing a hue with respect to a set color conversion target. FIG. 11 shows an example of a color conversion target which is set using the above Munsell hue circle and an example of changing a hue with respect to the color conversion target.

FIG. 11 represents an example of a color conversion relational expression in which a hue before color conversion (a real-time chromatic image taken by the inner camera 23 or the outer camera 25) is indicated as a hue angle X in the Munsell hue circle along a horizontal axis, and a hue after color conversion is indicated as a hue angle Y in the Munsell hue circle along a vertical axis. In FIG. 11, a graph indicating a relational expression between the hue angle Y and the hue angle X is represented using a heavy line.

For example, it is assumed that a hue of a pixel of a taken image which corresponds to a touch position TP by the user is green, and the green is color-converted into purple. Hereinafter, a hue angle X of the hue (e.g. the hue "green") of the pixel of the taken image which corresponds to the touch position TP is set to X0, a hue angle Y of the above conversion target hue (e.g. the hue "purple") is set to Y0. In this case, a range having a hue angle of ΔXs+ΔXg before and after the hue "green" (the hue angle X0) as a center thereof in the Munsell hue circle (i.e. a range having a hue angle of 2ΔXs+ΔXg) is set as the range of the color conversion target.

Here, a hue angle which is smaller than the hue angle X0 by a hue angle of ΔXs Xls, and a hue angle which is larger than the hue angle X0 by the hue angle of ΔXs is Xrs. In this case, all hues which belong to a range having a hue angle of ΔXs before and after the hue "green" (the hue angle X0) as a center thereof in the Munsell hue circle, namely, all hues of hue angles X which belong to a range from the hue angle Xls to the hue angle Xrs, are converted into the conversion target hue (the hue angle Y0).

Further, a hue angle which is smaller than the hue angle Xls by a hue angle of ΔXg is Xle. In this case, hues of hue angles X which belong to a range from the hue angle Xle to the hue angle Xls are converted into hues of hue angles Y indicated by the following equation:

$$Y=X+\text{dif}*\text{effl},$$

where effl=(Xle−X)/(Xle−Xls).

Further, when |Y0−X|≤180°, $$\text{dif}=Y0-X\text{, and}$$

when |Y0−X|>180°, $$\text{dif}=360°-(Y0-X).$$

Further, a hue angle which is larger than the hue angle Xrs by the hue angle of ΔX g is Xre. In this case, hues of hue angles X which belongs to a range from the hue angle Xrs to the hue angle Xre are converted into hues of hue angles Y indicated by the following equation:

$$Y=X+\text{dif}*\text{effr};$$

where effr=(X−Xre)/(Xrs−Xre).

It is noted that for pixels having hues outside the range of the color conversion target, namely, for pixels having hues of hue angles which do not belong to the range from the hue angle Xle to the hue angle Xre which has the hue angle X0 at the center thereof, the hues are not converted, and are maintained without change. In other words, for the pixels having the hues outside the range, the hue angles X a reconverted into hue angles Y indicated by the following equation:

$$Y=X.$$

Thus, for the pixels having the hue angles X outside the range, the hue angles X are converted into the hue angles Y of which hues are maintained without change.

It is noted that in the above example in which the relational expression between the hue angle X and the hue angle Y and the range of the color conversion target are set, the hue angle X and the hue angle Y are set in polar coordinates. Thus, it should be understood that it has to be taken into consideration that when a calculation result, or the like is beyond 360°, 360° is subtracted from the calculation result to be handled. Further, the color conversion processing operation in the fifth example is similar to the above operation based on the flow chart in FIG. 9, but instead of "changing saturation in the conversion table" at the step 57, "hue in the conversion table is changed" in accordance with the above color conversion relational expression.

As described above, according to the fifth example, by setting a range in which a hue before color conversion is color-converted so as to be gradually increased to be close to the conversion target hue while hues away within a predetermined hue angle from the hue of the pixel corresponding to the touch position TP are color-converted, a color which is originally obtained in imaging can be expressed so as to be naturally changed to a predetermined color. Further, the user can generate an image in which a desired color is converted into another color only by performing a touch operation a tone point with respect to the display image displayed on the lower LCD 12. Still further, by making setting such that a hue becomes close to a hue before color conversion in a phase manner with a hue selected in accordance with a touch operation being set as a center, noise can be reduced in performing color conversion, and it is possible to convert into an image such that a color at a position at which the touch operation is performed is naturally changed.

It is noted that although, in the above description, a hue which belongs to the hue angle which is the center of the range of the color conversion target is converted into the conversion target hue, hues which belong to hue angles adjacent to the center are color-converted so as to be gradually close to the conversion target hue, other color conversion may be performed. For example, all hues which belong to hue angles within the range of the color conversion target may be cooler-converted into the above conversion target hue.

Further, although the above description is an example in the case of only once performing color conversion in accordance with a touch operation by the user with respect to a displayed image from a state where an original image (a real-time chromatic image taken by the inner camera 23 or the outer camera 25) is displayed, color conversion may be repeatedly performed after the color conversion is performed. Still further, although, in the above description, the conversion target hue is set as the hue angle Y which is a fixed value, the conversion target hue may be a value which is changed in accordance with a touch operation by the user. The following will describe a case where the conversion target hue is changed in accordance with a touch operation by the user and color conversion is repeatedly performed.

For example, it is assumed that at a certain point, a hue angle X of pixels of a taken image is changed to a hue angle f(X) by color conversion processing performed last time, and a resultant image is displayed on the screen. It is assumed that in this state, the user performs a touch operation again to further perform color conversion, the hue angle X of the pixels of the taken image is changed to a hue angle f (X), and a resultant image is displayed on the screen. Further, it is assumed that a hue of a pixel of the taken image which corresponds to a touch position TP by the user is the hue angle X0 (the hue of the pixel corresponding to the touch position TP which is displayed on the screen is the hue angle Y0=f(X0) before the touch operation, and a hue angle Y1=f (X0) after the touch operation). In this case, a range having a hue angle of ΔXs+ΔXg before and after the hue angle X0 as a center thereof in the Munsell hue circle (i.e. a range having a hue angle of 2ΔXs+2ΔXg) is set as the range of the color conversion target this time.

It is assumed that by the touch operation of this time, the hue of the pixel corresponding to the touch position TP which is displayed on the screen is the hue angle Y1. In other words, the conversion target hue of this time is the hue angle Y1. This value is set as a value obtained by adding a predetermined hue angle change amount A to the hue angle Y0 (=f(X0)) of the pixel corresponding to the touch position TP which is displayed on the screen before the touch operation. More specifically, the hue angle Y1 which is a new conversion target hue is represented by the following equation:

$$Y1=f(X0)+A.$$

In other words, if the hue angle X of the hue of the pixel of the taken image which corresponds to the touch position TP is changed to the hue angle f(X) by the color conversion processing performed last time, all hues of hue angles X which belong to the range from the hue angle Xls to the hue angle Xrs are converted into the new conversion target hue (the hue angle Y1=f(X)+A) by the color conversion processing of this time.

Further, if the hue angle X of the hue of the pixel of the taken image which corresponds to the touch position TP is changed to the hue angle f(X) by the color conversion processing performed last time, hues of hue angles X which belongs to the range from the hue angle Xle to the hue angle Xls are converted by the color conversion processing of this time into hues of hue angles f (X) indicated by the following equation:

$$f(X)=f(X)+\mathrm{dif}*\mathrm{eff}l.$$

Here, when |Y1−f(X)|≤180°, $$\mathrm{dif}=Y1-f(X),\ \text{and}$$

when |Y1−f(X)|>180.degree, $$\mathrm{dif}=360°-(Y1-f(X)).$$

Y1 is a hue angle of the conversion target hue which is newly set in the color conversion processing of this time.

Further, if the hue angle X of the hue of the pixel of the taken image which corresponds to the touch position TP is changed to the hue angle f(X) by the color conversion processing performed last time, hues of hue angles X which belongs to the range from the hue angle Xrs to the hue angle Xre are converted into hues of hue angles f (X) indicated by the following equation:

$$f(X)=f(X)+\mathrm{dif}*\mathrm{eff}r.$$

It is noted that for the pixels having hues outside the range of the color conversion target, namely, for the pixels having hues of hue angles which do not belong to the range from the hue angle Xle to the hue angle Xre which has the hue angle X0 at a center thereof, the hues are not converted, and are maintained without change even at color conversion for the second time and thereafter. In other words, if the hue angle X of the hue of the pixel of the taken image which corresponds to the touch position TP is changed to the hue angle f (X) by the color conversion processing performed last time, hue angles X of the pixels having the hues outside the range are converted into hue angles f (X) indicated by the following equation:

$$f(X)=f(X).$$

Thus, for the pixels having the hues outside the range, the hues are maintained even at the color conversion for the second time and thereafter.

Further, when a touch operation is further performed with respect to another pixel after a hue within a first color conversion range having at a center thereof a hue of a pixel which a touch operation is performed with respect to is changed to a first hue in accordance with the touch operation by the user with respect to the above real-time chromatic image, a hue within a second color conversion range having at a center thereof a hue of the other pixel may be converted into a second hue. In this case, every time a touch position TP is obtained, a different color conversion range is set in accordance with the touch position TP, and another conversion target hue is set in accordance with the color conversion range. Thus, color conversion is performed such that a hue is changed with a different hue being set as a conversion target for each touch operation. It is noted that a conversion target hue which is set with respect to the first color conversion range may be the same as a conversion target hue which is set with respect to the second color conversion range. In this case, even when the user performs a touch operation at positions of different hues with respect to the above real-time chromatic image, the hues which the touch operation is performed with respect to are color-converted into the same hue.

It is noted that in the case where the above first color conversion range and the above second color conversion range partially overlap with each other, the above relational expression is applied even to the overlapping range where the color conversion ranges overlap with each other for each color conversion. Thus, by smoothly connecting the hue angles in the overlapping range between the first color conversion range and the second color conversion range after the conversion, it is possible to perform color conversion processing without an uncomfortable feeling.

Here, in the case where the above first color conversion range and the above second color conversion range partially overlap with each other, a hue angle may be set by another method. As a first example, among a hue angle which is set with respect to each color conversion range, a hue angle which is changed more largely (namely, a hue angle which is changed more largely from an original image) is selected. As a second example, hue angles after conversion are smoothly connected in accordance with largeness of the overlapping range between the first color conversion range and the second color conversion range. As described above, even when the hue angles in the overlapping range between the first color conversion range and the second color conversion range are combined, it is possible to perform color conversion processing without an uncomfortable feeling by smoothly connecting the hue angles in the overlapping range.

Further, in the above description, the color conversion processing of changing one of color attributes (three attributes, namely, saturation, brightness, and hue) is performed for the pixels having the hues within the range of the color conversion target. However, for pixels having hues outside the range, the color conversion processing may be performed. For example, for the pixels having the hues outside the range, processing which is different from the color conversion processing performed for the pixels having the hues within the range (e.g. a color attribute to be changed is different, or a color attribute to be changed is the same but a direction of change is different) is performed, thereby enabling various color conversion processing to be easily performed with respect to the taken image. Here, if the direction of change is different, when the color conversion processing of increasing saturation or brightness within the range is performed, color conversion processing of decreasing saturation or brightness outside the range is performed. Or, when color conversion processing of changing the hues within the range is performed in order of the forward direction in a color system, color conversion processing of changing the hues outside the range is performed in order of the reverse direction in the color system.

Further, in the above description, an RGB value of each pixel of a taken image is converted into a hue using the conversion table to generate a display image, and color conversion is performed such that at least one of saturation, brightness, and hue which are described in the conversion table is changed. However, color conversion may be performed by another method. For example, image data may be changed by directly changing at least one of saturation, brightness, and hue of an image being displayed (e.g. a taken image) without changing the conversion table with respect to a calculated conversion target range.

Further, in the above description, a real-time image (a taken image) taken by the inner camera 23 or the outer camera 25 is used as an image to be color-converted. However, another image may be the image to be color-converted. For example, the game apparatus 1 is capable of performing a photographing instruction by the user pressing a predetermined button, and an image taken in accordance with the photographing instruction may be an image to be treated with the color conversion processing.

More specifically, the user can perform a instruction to perform photographing using the inner camera 23 or the outer camera 25 by pressing the operation button 14G or the operation button 14H of the game apparatus 1. Then, by the photographing processing, an image taken by the inner camera 23 or the outer camera 25 can be stored in the stored data memory 34 or the memory card 28. If, at the step 51, the CPU 31 obtains the image obtained by such photographing processing, the image stored once in the stored data memory 34 or the memory card 28 can be used as an image to be treated with the color conversion processing.

It should be understood that the image stored in the stored data memory 34 or the memory card 28 is not limited to an image taken by the game apparatus 1, and even if the image stored in the stored data memory 34 or the memory card 28 is another image (an image taken by another apparatus, an image obtained by communication with another apparatus, an image pre-installed in the stored data memory 34 or the memory card 28, and the like), the image may be used as an object to be treated with the color conversion processing. Further, an image pre-installed in the memory card 29 (e.g. a game image displayed by a game program stored in the memory card 29) may be used as the object to be treated with the color conversion processing. In these cases, it should be understood that even if the game apparatus 1 does not have an imaging function, such as the inner camera 23, the outer camera 25, and the like, certain example embodiments can be realized.

Further, the case where the game apparatus 1 takes and stores a still image using the inner camera 23 and the outer camera 25 has been described as an example. However, in addition to the still image, the game apparatus 1 may take and store a moving image using the inner camera 23 or the outer camera 25. In this case, the moving image taken and stored using the inner camera 23 or the outer camera 25 is used as an image to be treated with the color conversion processing.

The game apparatus 1 may change an LCD for displaying a real-time image taken by the inner camera 23 or the outer camera 25, for example, between the upper LCD 22 and the lower LCD 12 in accordance with a change instruction from the user, or may cause a real-time image taken by the inner camera 23 or the outer camera 25 to be displayed on both LCDS. In this case, a taken image, namely, a display image which has been treated with the color conversion processing, is also displayed on the upper LCD 22.

Further, in the embodiment described above, the case where the lower LCD 12 and the upper LCD 22 physically separated from each other are arranged one above the other (the case of two screens above and below) has been described as an example of a LCD display section having two screens. However, a configuration of a display section having two screens may be another configuration. For example, the lower LCD 12 and the upper LCD 22 may be arranged on a main surface of the lower housing 11 laterally side by side. Alternatively, a vertically long LCD having the same width as that of the lower LCD 12 and a vertical length which is twice as large as that of the lower LCD 12 (namely, an LCD which is physically one unit and has a display size with a vertical length equal to a sum of vertical lengths of two screens may be provided in the main surface of the lower housing 11, and the above two images (namely, a display image obtained by changing a taken image to a monochrome image, and an image showing an operation explanation screen) may be displayed one above the other (displayed so as to be adjacent to each other without a boundary portion between above and below). Still alternatively, a horizontally long LCD having the same vertical length as that of the lower LCD 12 and a width which is twice as large as that of the lower LCD 12 may be provided in the main surface of the lower housing 11, and the two game images may be displayed laterally side by side (displayed so as to be adjacent to each other without a boundary portion between left and right). In other words, a physically one screen may be divided into two and used to display two images. In either form of an image, if the touch panel 13 is provided on a screen on which the display image displayed on the lower LCD 12 is displayed, certain example embodiments can be realized similarly. Alternatively, in the case where the physically one screen is divided into two and used to display the two images, the touch panel 13 may be provided on an entirety of the screen.

Further, in the embodiment described above, the game apparatus 1 is provided integrally with the touch panel 13. However, even if the game apparatus and the touch panel may be provided independently of each other, it should be understood that other example embodiments can be realized. Alternatively, the touch panel 13 may be provided on an upper surface of the upper LCD 22, and the display image displayed on the lower LCD 12 may be displayed on the upper LCD 22. Further, although the two display screens (the lower LCD 12 and the upper LCD 22) are provided in the above embodiment, only one display screen may be provided. In other words, in the above embodiment, the upper LCD 22 may not be provided, only the lower LCD 12 may be provided as a display screen, and the touch panel 13 may be provided on the lower LCD 12. Still alternatively, in the above embodiment, the lower LCD 12 may not be provided, the touch panel 13 may be provided on the upper surface of the upper LCD 22, and the display image displayed on the lower LCD 12 may be displayed on the upper LCD 22.

Further, in the embodiment described above, as input means of the game apparatus 1 for realizing an coordinate input, the touch panel 13 is used. However, another pointing device may be used. Here, the pointing device is an input device for designating an input position or coordinates on a screen, and, for example, a mouse, a trackpad, a trackball, or the like is used as the input device. When position information in a screen coordinate system calculated from an output value outputted from the input device is used, certain example embodiments can be realized similarly.

In this case, when the position information in the screen coordinate system is treated as a touch position TP, the present invention can be realized. In this regard, instead of the determination as to whether or not there is an input such as a touch-on, a touch-off, and the like in the above processing, existence/nonexistence of or change in another input from the input means which is different from the input of the position information is used. For example, a determination as to whether or not an operation button provided in the input means is pressed (e.g. right click or left click of the mouse) is used instead of the determination of the touch-on or the touch-off.

Further, in the case of a stationary game apparatus whose game controller is held by a player while a game is played, a pointing device in another form is considered. For example, a camera fixed to a housing of the game controller can be used as the pointing device. In this case, in accordance with change in a position at which the housing of the game controller is pointed, an image taken by the camera is changed. Thus, by analyzing the taken image, coordinates at which the housing is pointed with respect to a display image can be calculated.

In this case, when the coordinates indicative of the position at which the housing is pointed is treated as a touch position TP, certain example embodiments can be realized. In this regard, instead of the determination as to whether or not there is an input such as a touch-on, a touch-off, and the like in the above processing, existence/nonexistence of or change in another input from the game controller which is different from the coordinate input is used. As a first example, a determination as to whether or not an operation button provided in the game controller is pressed (e.g. a touch-on is performed when an A button is pressed) is used instead of the determination of the touch-on or the touch-off. In a second example, the game controller includes two housings. A camera is provided in one of the two housings, and a detection section, such as an acceleration sensor for outputting a signal in accordance with movement of the other housing, and the like, is fixed to the other housing. In this case, a determination in accordance with the movement of the other housing (e.g. a touch-on is performed when the housing is inclined in a predetermined direction) is used instead of the determination of the touch-on or the touch-off. In a third example, voice input means such as a microphone or the like is provided in the housing of the game controller. In this case, a determination to switch between a touch-on and a touch-off when the player produces a predetermined voice is used instead.

Further, the above embodiment has been described using the hand-held game apparatus 1 and the stationary game apparatus. However, certain example embodiments may be realized by an information processing unit, such as a common personal computer and the like, executing the color conversion processing program.

Further, the shape of the above game apparatus 1, and the shapes, numbers, and installed positions of the operation buttons 14 and the touch panel 13 provided therein are merely an example, and certain example embodiments can be realized with other shapes, numbers and installed positions. Further, the set values and the determination values which are used in the above color conversion processing are merely an example, and certain example embodiments may use other values.

While certain example embodiments have been described in detail, the foregoing description is in all aspects illustrative and not restrictive. It is understood that numerous other modifications and variations can be devised without departing from the scope of the invention.

The color conversion apparatus, the imaging apparatus, the storage medium storing the color conversion program, and the storage medium storing the imaging program according to certain example embodiments are useful as apparatuses which are capable of performing color conversion desired by the user with respect to a displayed image in accordance with an easy operation and perform color conversion of various images such as taken images, and the like, and as programs executed by these apparatuses, and the like.

While certain example embodiments have been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A color conversion apparatus for performing color conversion processing on an image, the color conversion apparatus comprising:

a display device that is configured to display a first display image, the display image being a chromatic original image;

input position obtaining processing circuitry for obtaining a first input position that is associated with a position selected by a user within the first display image;

hue obtaining processing circuitry for obtaining a first hue of the first display image corresponding to the first input position obtained by the input position obtaining processing circuitry;

conversion target range setting processing circuitry for setting a first conversion target hue range having the first hue obtained by the hue obtaining processing circuitry at a center thereof; and color conversion processing circuitry for changing at least one of saturation, brightness, and hue with respect to each one of a plurality of pixels of the first display image which has a hue within the first conversion target hue range so as to be close to a first conversion target hue, wherein the display device is further configured to output a resultant image based on the changed first display image, wherein the input position obtaining processing circuitry further obtains a second input position specified by the user within the resultant image while the resultant image is displayed on the display device, wherein the hue obtaining processing circuitry further determines a second hue that corresponds to the second input position within the first display image, the second hue being different from a corresponding hue in the displayed resultant image at the second input position, wherein the conversion target range setting processing circuitry determines a second hue range with the second hue at a center thereof, wherein the color conversion processing circuitry creates a new resultant image by updating each pixel of the first display image that has a hue within the second hue range so as to be close to a second conversion target hue, wherein the display device is further configured to output the new resultant image.

2. The color conversion apparatus according to claim 1, wherein the display device is further configured to display the first display image which is converted into an achromatic image by decreasing saturation of all pixels of the chromatic original image, and the color conversion processing circuitry returns saturation of a pixel of the first display image which has a hue within first conversion target hue range to saturation in the original image, and displays another resultant image on the display device.

3. The color conversion apparatus according to claim 2, wherein the color conversion processing circuitry changes saturation of a pixel having a hue within the first conversion target hue range which is away from a center of the first conversion target hue range while gradually decreasing a rate of returning the saturation of the pixel to saturation in the original image as the hue is away from the center.

4. The color conversion apparatus according to claim 3, wherein the color conversion processing circuitry changes saturation of a pixel having a hue within the first conversion target hue range which is away from the center of the first conversion target hue range while linearly decreasing a rate of returning the saturation of the pixel to saturation in the original image from 100% to 0% as the hue is away from the center.

5. The color conversion apparatus according to claim 1, wherein when the input position obtaining processing circuitry obtains a plurality of input positions at different timings, the hue obtaining processing circuitry obtains a hue of the first display image corresponding to each of the input positions, the conversion target range setting processing circuitry sets a plurality of predetermined hue ranges having the hues obtained by the hue obtaining processing circuitry at centers thereof, the plurality of predetermined hue ranges including the first conversion target hue range and another conversion target hue range, and the color conversion processing circuitry changes at least one of saturation, brightness, and hue with respect to a pixel of the display image which has a hue within the first conversion target range and a pixel of the display image which has a hue within the another conversion target hue range, and displays a resultant image on the display device.

6. The color conversion apparatus according to claim 5, wherein the color conversion processing circuitry changes at least one of saturation and brightness of a pixel having a hue within the first conversion target hue range which is away from the center of the first conversion target hue range while gradually decreasing a rate of changing at least one of the saturation and the brightness of the pixel as the hue is away from the center, the color conversion processing circuitry changes at least one of saturation and brightness of a pixel having a hue within the another conversion target hue range which is away from the center of the another conversion target hue range while gradually decreasing a rate of changing at least one of the saturation and the brightness of the pixel as the hue is away from the center, and when the first conversion target hue range and the another conversion target hue range partially overlap with each other, the color conversion processing circuitry selects a higher rate among a rate of changing at least one of saturation and brightness for the first conversion target hue range and a rate of changing at least one of saturation and brightness for the another conversion target hue range, and changes at least one of saturation and brightness of a pixel having a hue within an overlapping range.

7. The color conversion apparatus according to claim 5, wherein the color conversion processing circuitry changes at least one of saturation and brightness of a pixel having a hue within the first conversion target hue range which is away from the center of the first conversion target hue range while gradually decreasing a rate of changing at least one of the saturation and the brightness of the pixel as the hue is away from the center, the color conversion processing circuitry changes at least one of saturation and brightness of a pixel having a hue within the another conversion target hue range which is away from the center of the another conversion target hue range while gradually decreasing a rate of changing at least one of the saturation and the brightness of the pixel as the hue is away from the center, and when the first conversion target hue range and the another conversion target hue range partially overlap with each other, the color conversion processing circuitry changes a rate of changing at least one of saturation and brightness of a pixel having a hue within an overlapping range in a curved manner such that a center of the overlapping range becomes minimum.

8. The color conversion apparatus according to claim 1, further comprising an imager for taking an image of a vicinity of the color conversion apparatus, wherein the display device is further configured to display an image taken by the imager as the first display image in real time.

9. The color conversion apparatus according to claim 1, wherein the color conversion processing circuitry converts the first display image into an achromatic image by decreasing saturation of a pixel of the first display image which has a hue within the conversion target range, and displays the achromatic image on the display device.

10. The color conversion apparatus according to claim 1, wherein the display device is further configured to display the first display image whose pixels are converted into black pixels by decreasing brightness of all pixels of the chromatic original image, and the color conversion processing circuitry returns brightness of a pixel of the first display image which has a hue within the conversion target range to brightness in the original image, and displays a resultant image on the display device.

11. The color conversion apparatus according to claim 1, wherein the color conversion processing circuitry decreases brightness of a pixel of the first display image which has a hue within the first conversion target hue range, and displays a resultant image on the display device.

12. The color conversion apparatus according to claim 1, wherein the color conversion processing circuitry changes a hue of a pixel having the hue which is within the first conversion target hue range and away from a center of the first conversion target hue range so as to be close to the conversion target hue as the hue is close to the center.

13. The color conversion apparatus according to claim 1, wherein when the first conversion target hue range and the second hue range partially or entirely overlap with each other, the color conversion processing circuitry changes, with respect to a pixel having a hue within the overlapping range, a hue of the pixel which is changed for the first conversion target hue range so as to be close to the second conversion target hue based on the changed hue.

14. The color conversion apparatus according to claim 1, wherein when the input position obtaining processing circuitry obtains an input position, the color conversion processing circuitry sets the first conversion target hue based on a hue of a pixel at the input position which is displayed on the display device immediately before the input position is obtained.

15. The color conversion apparatus according to claim 1, wherein when the input position obtaining processing circuitry obtains the second input position, the color conversion processing circuitry sets the second conversion target hue based on a hue of a pixel at the second input position which is displayed on the display device before the second input position is obtained.

16. The color conversion apparatus according to claim 1, wherein the color conversion processing circuitry sequentially changes the first conversion target hue as time passes, and displays a resultant image on the display device.

17. The color conversion apparatus according to claim 1, wherein the color conversion processing circuitry further changes a color attribute with respect to a pixel of the display image which has a hue outside the first conversion target range in a manner which is different from a manner of changing a color attribute with respect to a pixel having a hue within the first conversion target range, and displays a resultant image on the display device.

18. An imaging apparatus for processing an image, the imaging apparatus comprising:

an imager configured to continually capture images of real world objects;

a display;

a processing system that includes at least one processor, the processing system coupled to the display, the processing system configured to:

alter the continually captured images so that a color of at least some pixels of the continually captured images are different in an altered image of a respective captured image;

output the altered continually captured images to the display for display thereon in a substantially real-time manner relative to the capturing of a respective image;

receive user input indicating a position on the display, where the display is displaying the altered continually captured images;

determine a first input position based on the received user input, the first input position corresponding to a location within the continually captured images;

obtain a hue from the continually captured images based on indicated position, the hue from the continually captured images being different from a corresponding hue at substantially the same location in the altered continually captured images;

set a hue range, with the obtained hue at a center of the hue range;

alter the continually captured images to change at least one of saturation, brightness, and/or hue for a pixel of the continually captured images which has a hue within the set hue range so as to be close to a conversion target hue; and output a resultant image to the display device based on the alteration of the continually captured images to change at least one of saturation, brightness, and/or hue for the pixel to be close to the conversion target hue.

19. A non-transitory computer-readable storage medium storing computer readable instructions for adjusting an image on a computing system that includes at least one processor and at least one display device, the stored instructions comprising instructions that are configured to:

display a taken image that is taken by an image capture device that is configured to take an image of a vicinity on the display device in real time;

display an altered form of the taken image, the altered form of the taken image including at least some pixels that have a different color attribute than corresponding pixels in the taken image;

while the altered form of the taken image is displayed:

obtain an input position based on user provided input that indicates a position on the display device within the displayed altered form of the taken image, the input position associated with at least one pixel in the displayed altered form of the taken image;

obtain a hue from the taken image based on the obtained input position;

determine a hue range having the obtained hue at a center thereof; and change at least one of saturation, brightness, and hue of a portion of the taken image, the portion having a hue within the determined hue range so as to be close to a conversion target hue; and output a resultant image on the display device based on the changed portion of the taken image.

20. The apparatus of claim 1, wherein the first conversion target hue range is between first and second ranges that are calculated as being equidistant from the center of the first conversion target hue range.

21. An apparatus for performing color conversion on an image, the apparatus comprising:

a non-transitory storage medium that is configured to store an original image, the original image being a chromatic image;

a display device that is configured to display images on at least one screen of the display device;

a processing system that includes at least one processor, the processing system coupled to the non-transitory storage medium and the display device, the processing system configured to:

output an altered image for display on the at least one screen of the display device, the altered image based on the original image;

when the altered image is displayed on the at least one screen of the display device, obtain an input position indicated by a user specifying a position within the displayed altered image on the at least one screen of the display device;

determine a hue that corresponds to a hue in the original image based on the obtained input position;

determine a hue range where the determined hue is substantially in the center of the hue range;

create a new image by setting a color property of at least one pixel in the new image where a corresponding at least one pixel in the original image has a hue within the hue range, the color property being at least one of saturation, brightness, and hue; and output the created new image to the display device, wherein when the set color property includes hue, the set hue of the at least one pixel is set to be close to a conversion target hue.

22. The apparatus according to claim 21, wherein the hue is set for a pixel having the hue which is within the hue range and away from a center of the hue range so as to be close to the conversion target hue as the hue is close to the center of the hue range.

23. The apparatus according to claim 21, wherein the conversion target hue is set based on a hue of a pixel at the input position which is displayed on the display device before the input position is obtained.

24. The apparatus according to claim 21, wherein the conversion target hue is changed over a period of time.

25. The apparatus according to claim 21, wherein the processing system is further configured to set a color property with respect to a pixel of the new image which has a hue outside the conversion target range in a manner which is different from a manner of changing a color property with respect to a pixel having a hue within the conversion target range.

26. The apparatus of claim 1, wherein the position is selected via a pointing device.

27. The apparatus of claim 18, wherein the received user input is provided via a pointing device operated by a user.

28. The apparatus of claim 21, wherein the user specifies the position via a pointing device.

29. The apparatus of claim 21, wherein the conversion target hue is outside the determined hue range.

30. The apparatus of claim 21, wherein the altered image includes a pixel that has a hue within the determined hue range and the original image has a corresponding pixel with a hue outside the determined hue range, wherein a pixel in the new image has the same hue as the pixel that has a hue within the determined hue range of the altered image.

31. A method of color converting an image, the method comprising:

storing, to a storage medium, a first image that includes at least one pixel that is associated with a first hue;

displaying a second image on a screen of a display device, the second image based on the first image, the second image including at least one pixel that is associated with a second hue that is different from the first hue;

receiving, in accordance with the second image being displayed on the display device, user input that indicates a position within the second image, the position being associated with at least the at least one pixel of the second image, the position corresponding to a first image position within the first image, the first image position including the at least one pixel;

setting, via a processing system that includes at least one processor, a center hue based on at least one hue associated with the first image position within the first image;

determining, via the processing system, a hue range with the center hue substantially at the center thereof;

creating, via the processing system, a third image for display on the screen of the display device, the third image based on the first image, the creation of the third image including, for pixels in the first image that are within the determined hue range, setting a hue for corresponding pixels of the third image based on a target hue, the target hue being different from corresponding pixels from the display second image; and displaying the third image on the screen of the display device.

32. An image processing apparatus for color converting an image, the apparatus comprising:

a storage medium that is configured to store an original image that is chromatic;

a display device that includes at least one screen, the display device configured to display an altered image on the at least one screen, the altered image based on the original image where at least some of the pixels in the altered image have a different hue than corresponding pixels in the original image;

a processing system that includes at least one processor, the processing system configured to:

while the altered image is displayed, receive input indicating a position within the altered image, the position associated with at least one pixel that has a hue that is different from a hue of a corresponding pixel in the original image;

determine a hue from the original image based on the receive input of the indicated position; and determine a hue range with the determined hue substantially at the center thereof, wherein the display device is further configured to display a new image where each pixel, that is associated with a corresponding pixel of the original image that has a hue within the determined range, is set within a range of a target hue.

33. The method of claim 31, wherein the at least one hue is associated with the first image position through an association with at least one pixel that is associated with the first image position.

* * * * *